(12) United States Patent
Hagemeyer et al.

(10) Patent No.: US 7,713,810 B2
(45) Date of Patent: May 11, 2010

(54) METHOD FOR FABRICATING A LAYER ARRANGEMENT, LAYER ARRANGEMENT AND MEMORY ARRANGEMENT

(75) Inventors: Peter Hagemeyer, Dresden (DE); Wolfram Langheinrich, Dresden (DE)

(73) Assignee: Infineon Technologies AG (DE)

( * ) Notice: Subject to any disclaimer, the term of this patent is extended or adjusted under 35 U.S.C. 154(b) by 685 days.

(21) Appl. No.: 10/514,168

(22) PCT Filed: May 15, 2003

(86) PCT No.: PCT/DE03/01581

§ 371 (c)(1),
(2), (4) Date: Jun. 21, 2005

(87) PCT Pub. No.: WO03/098694

PCT Pub. Date: Nov. 27, 2003

(65) Prior Publication Data

US 2006/0008959 A1    Jan. 12, 2006

(30) Foreign Application Priority Data

May 16, 2002   (DE) ................. 102 21 884

(51) Int. Cl.
  *H01L 21/8238* (2006.01)
(52) U.S. Cl. .................. 438/230; 257/E21.632
(58) Field of Classification Search .......... 438/230, 438/510, 551; 257/E21.623
  See application file for complete search history.

(56) References Cited

U.S. PATENT DOCUMENTS 5,291,052 A    3/1994    Kim et al.
5,696,012 A   12/1997    Son
5,933,730 A    8/1999    Sun et al.

(Continued)

FOREIGN PATENT DOCUMENTS

DE          196 54 738 A1     12/1996

(Continued)

OTHER PUBLICATIONS

Sorab K. Ghandhi, "VLSI Fabrication Principles, Silicon and Gallium Arsenide", 1994, John Wiley & Sons, $2^{nd}$, pp. 452-454.*

(Continued)

*Primary Examiner*—W. David Coleman
(74) *Attorney, Agent, or Firm*—James L. Katz; Brinks Hofer Gilson & Lione

(57) ABSTRACT

The disclosed embodiments relate to a method for the production of a layer arrangement, a layer arrangement and a memory arrangement. According to one aspect at least one respectively laterally defined first layer sequence is embodied on a first surface area of a substrate and at least one respectively laterally defined second layer sequence is embodied on a second surface area of the substrate in order to produce a layer arrangement. A first side wall having a first thickness is respectively produced from a first electrically insulating material on at least one partial area of the side walls of the first and second layer sequences. A second side wall layer having a second thickness is respectively produced from a second electrically insulating material on at least one partial area of the first side wall layers and the second side wall layers are removed from the first layer sequences.

62 Claims, 8 Drawing Sheets

U.S. PATENT DOCUMENTS

| | | | |
|---|---|---|---|
| 6,037,222 | A | 3/2000 | Huang et al. |
| 6,160,317 | A | 12/2000 | Sun et al. |
| 6,462,374 | B2 | 10/2002 | Usuki et al. |
| 6,555,865 | B2 | 4/2003 | Lee et al. |

FOREIGN PATENT DOCUMENTS

| | | |
|---|---|---|
| EP | 0 305 741 A2 | 7/1988 |
| GB | 2 259 662 A | 8/2001 |
| JP | 62023150 | 1/1987 |
| JP | 7302852 | 11/1995 |
| JP | 9082952 | 3/1997 |
| JP | 11097562 | 4/1999 |

OTHER PUBLICATIONS

Wong et al., Sidewall Oxidation of Polycrystalline-Silicon Gate, IEEE Electron Device Letters, vol. 10, No. 9, Sep. 1989, pp. 420-422.

PCT International Search Report PCT/DE 03/01581, Nov. 27, 2003.

English Translation of the International Preliminary Examination Report "IPER" for International Patent Application No. PCT/DE2003/001581 to which the above-captioned patent application claims priority.

Widman, D, Mader, H, Friedrich, H (1998), "Technologie hochintegrierter Schaltungen", Kapitel 8.4, Springer Verlag, Berlin, ISBN 3-540-59357-8, pp. 288-299.

* cited by examiner

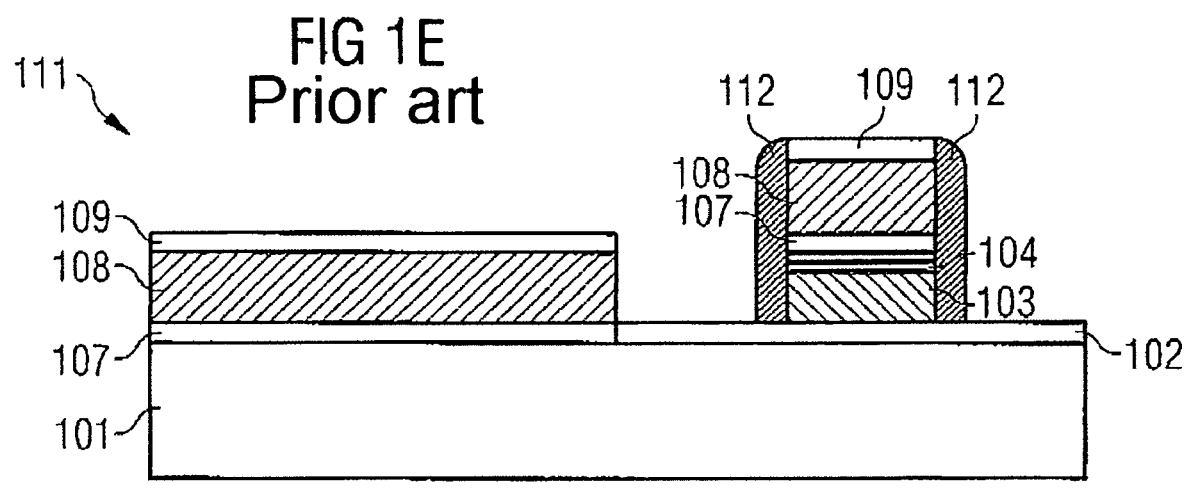
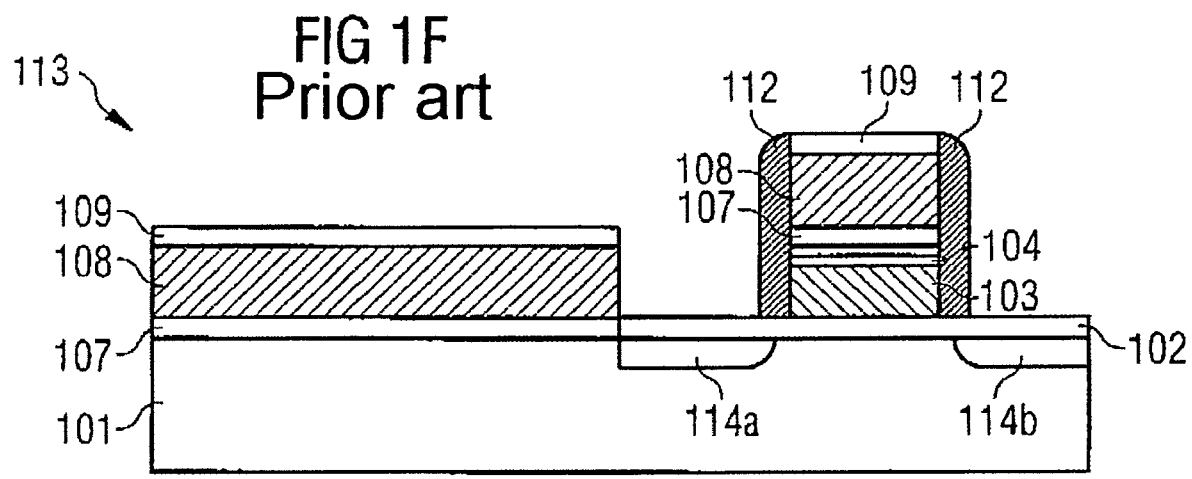

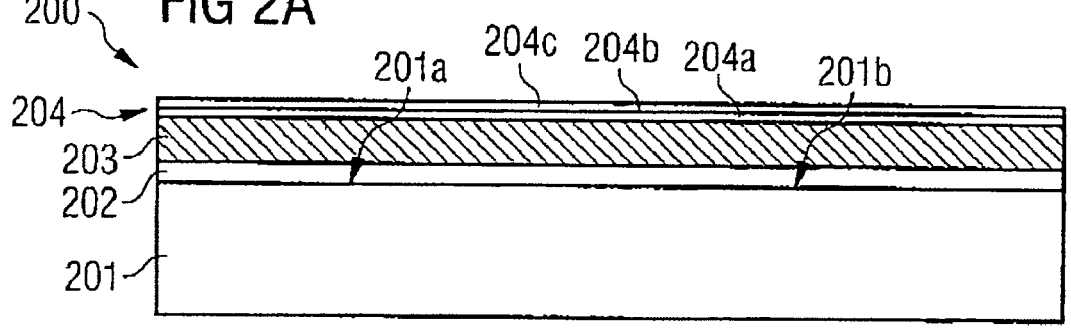
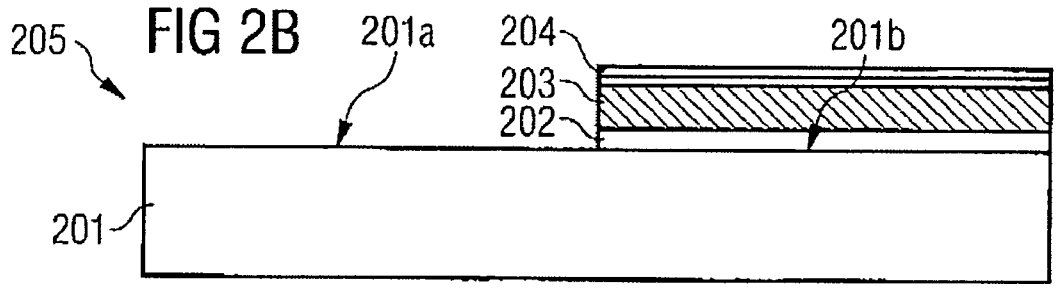
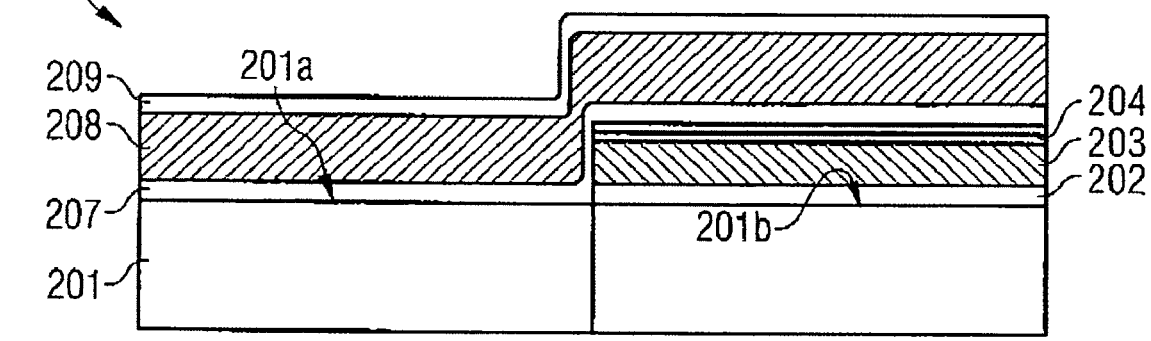
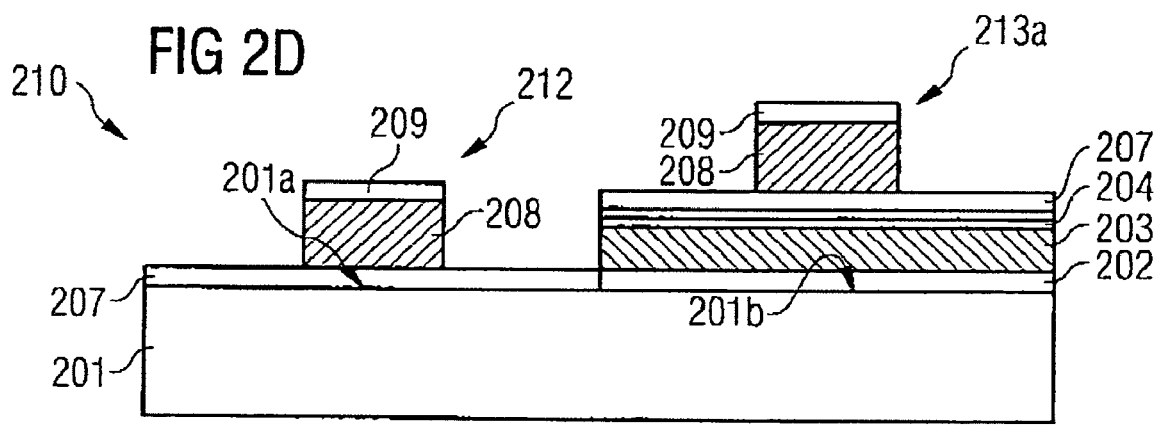

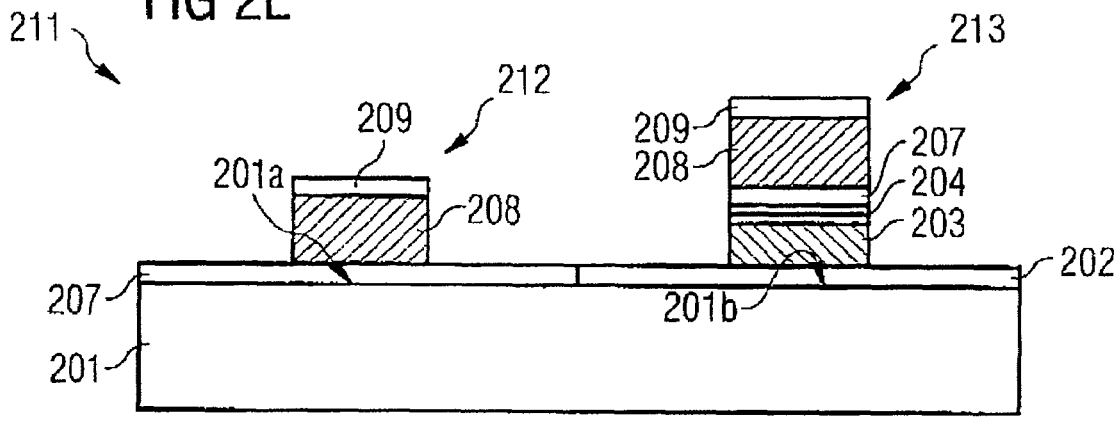
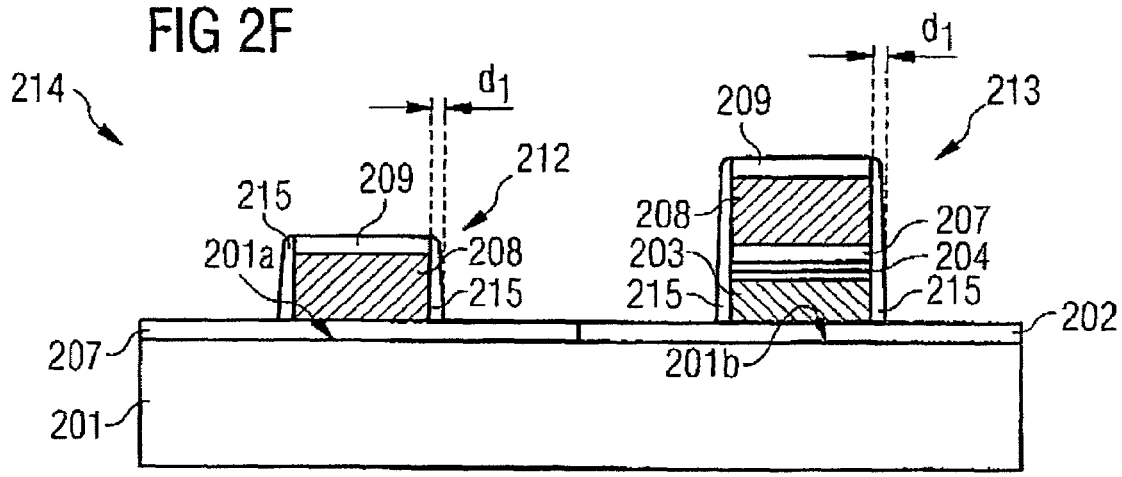
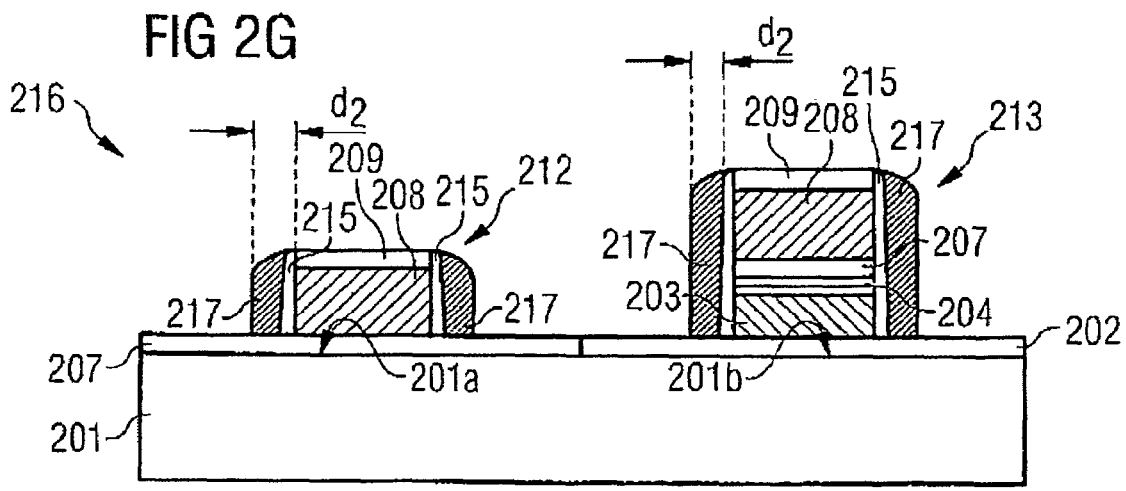

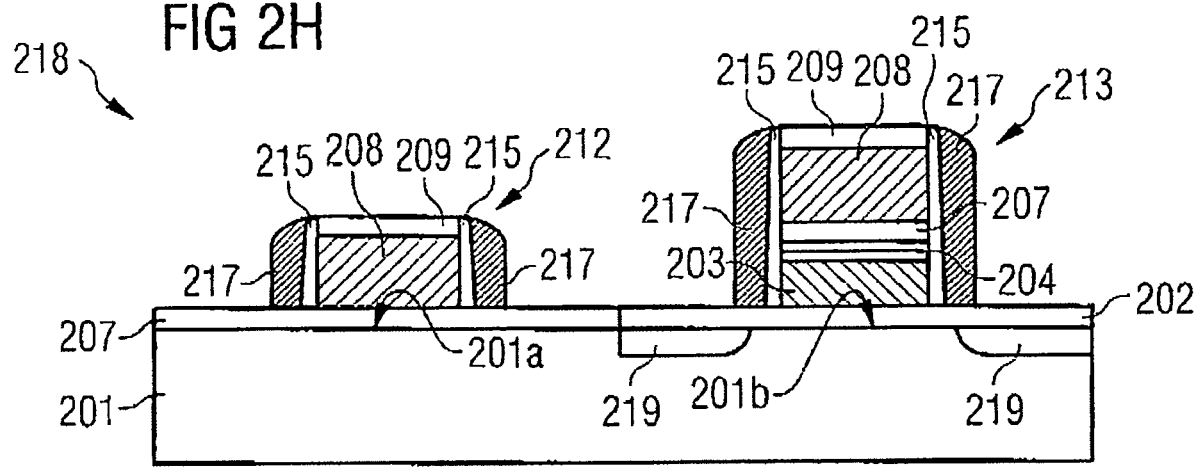
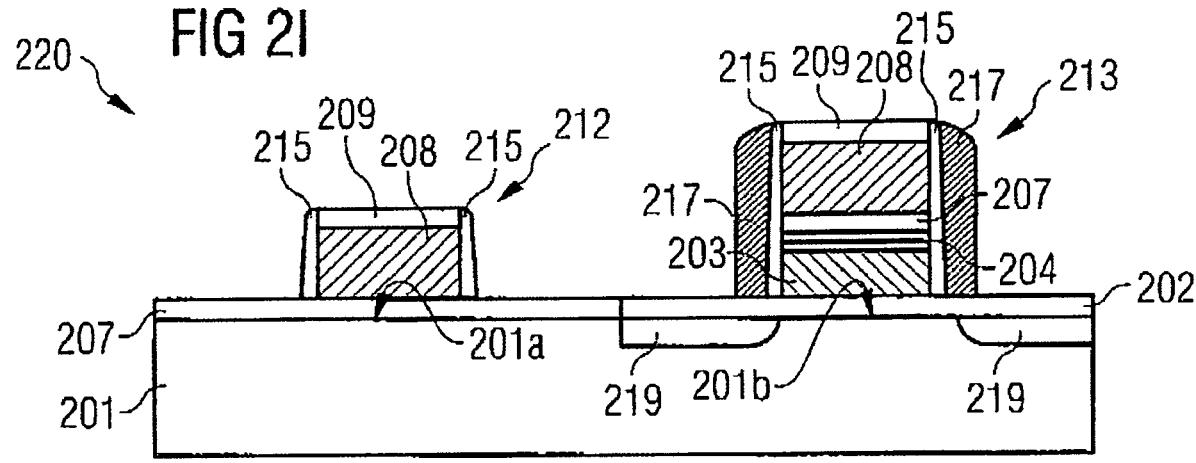
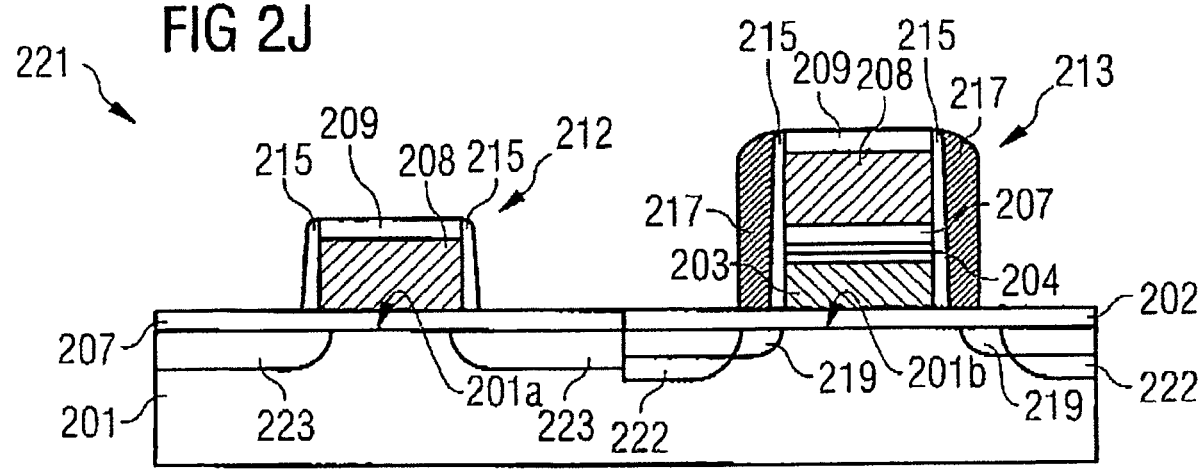

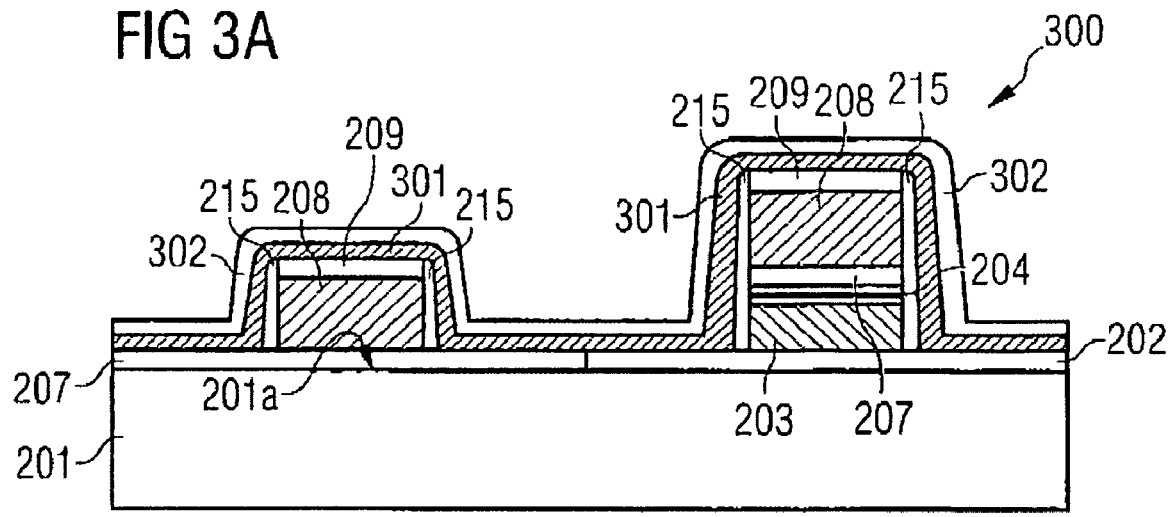
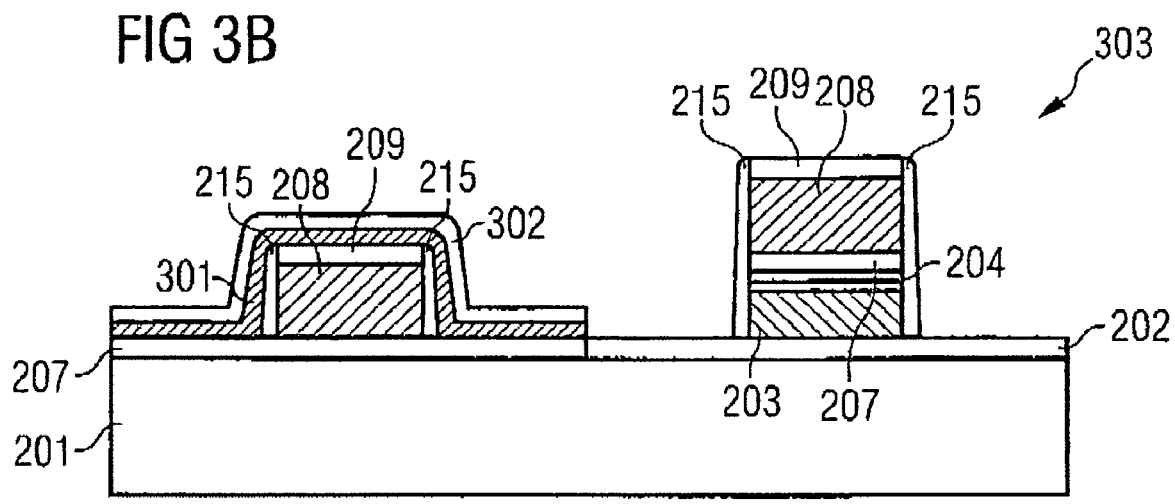
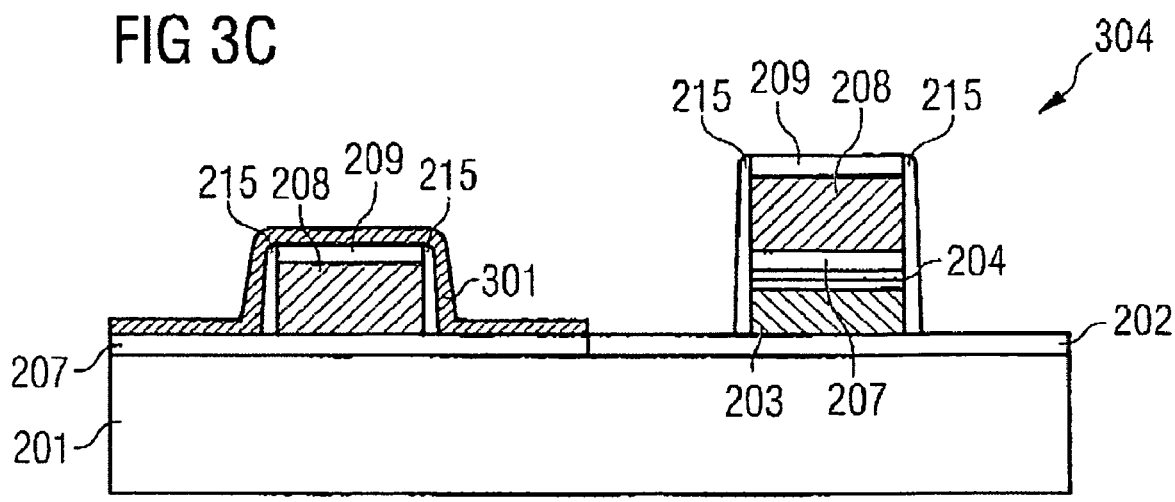

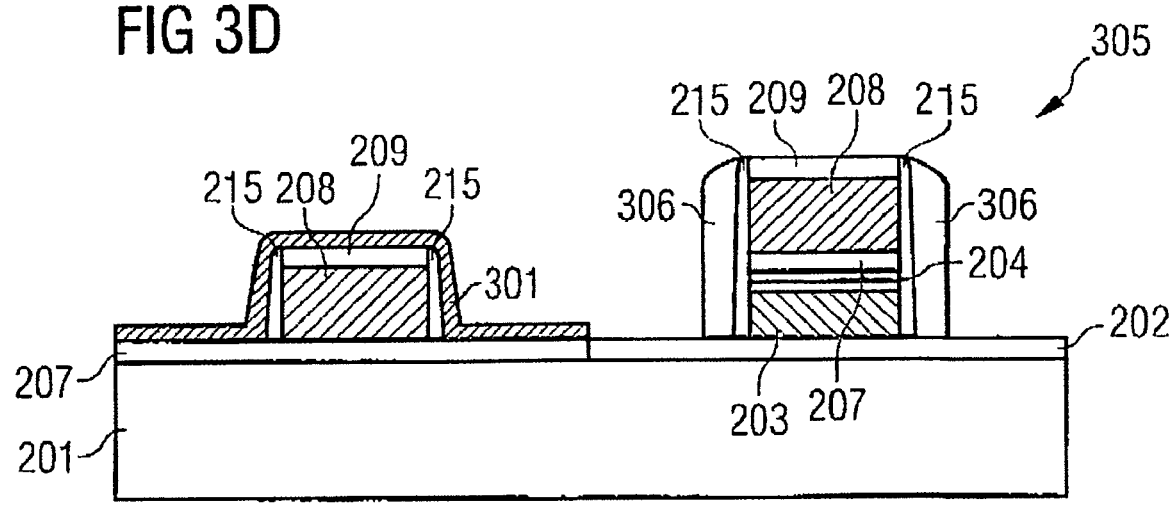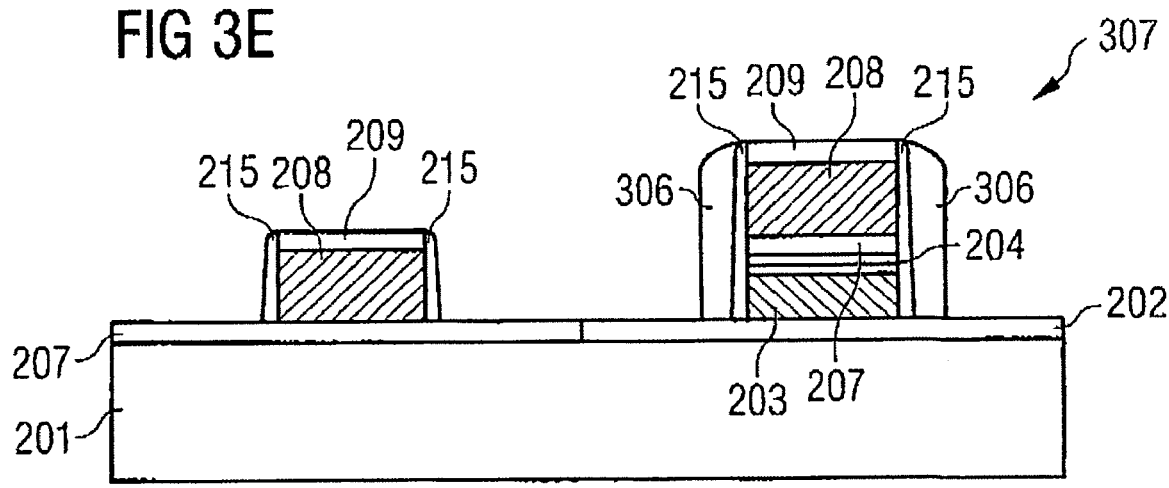

METHOD FOR FABRICATING A LAYER ARRANGEMENT, LAYER ARRANGEMENT AND MEMORY ARRANGEMENT

REFERENCE TO RELATED APPLICATIONS

This application is related to and claims the benefit of priority under 35 U.S.C. §§120, 271 and 365 to Patent Cooperation Treaty patent application no. PCT/DE2003/001581, filed on May 15, 2003, which was published at WO 2003/098694, in German.

This application is further related to and claims benefit of priority under 35 U.S.C. §119 to the filing date of May 16, 2002 of German patent application no. 10221884.6 DE, filed on May 16, 2002.

FIELD OF THE INVENTION

The invention relates to a method for fabricating a layer arrangement, to a layer arrangement and to a memory arrangement.

BACKGROUND

In view of the rapid ongoing development of computer technology, there is a need for a memory medium which makes it possible to store an ever greater quantity of information on ever smaller arrangements. In the field of non-volatile memories, which, once they have been programmed with the information item to be stored, retain this information item permanently without ever losing it, it is customary for data quantities of one bit or more to be stored in each transistor of a large arrangement of transistors. By way of example, Widmann, D, Mader, H, Friedrich, H (1996) "Technologie hochintegrierter Schaltungen" [Large-scale integrated circuit technology], Chapter 8.4, Springer Verlag, Berlin, ISBN 3-540-59357-8, provides a summary of non-volatile memories.

As miniaturization continues, conventional silicon microelectronics will reach its limits. In particular, the development of ever smaller and more densely arranged transistors, which has by now reached several hundred millions of transistors per chip, will come up against basic physical problems in the next ten years. When feature sizes drop below 80 nm, the components are disruptively affected by quantum effects, and these effects become dominant at sizes of below approximately 30 nm. Also, the increasing integration density of the components on a chip leads to a dramatic rise in the waste heat which is generated. Therefore, increasing the storage density of transistor arrangements by means of ongoing miniaturization of the structure dimensions is a concept which imposes high technological demands on the basic fabrication methods.

In the case of what is known as embedded technology, transistors with different requirements are integrated in a single integrated circuit, i.e. in a chip. For example, it may be necessary to integrate transistors of different configurations in a memory region of the chip (for example in a flash memory arrangement or an EEPROM) and in a logic region of the integrated circuit. In a scenario of this nature, different demands are imposed on the structural and physical parameters of the integrated transistors.

To form a transistor in a logic region, which logic region is to be sufficiently fast, a logic transistor of this type needs to be separated from its surroundings by a side wall oxide layer which is as thin as possible. A thin side wall oxide layer is necessary in a logic transistor in order to ensure a low connection resistance: a layer arrangement which serves as a logic transistor on a substrate can be coupled to the surroundings by doping atoms being injected into the boundary regions on both sides between the laterally delimited layer arrangement and the substrate ("lightly doped drain"). If in the case of a logic transistor, the side wall oxide layer is too thick, the region of overlap between the doped region in the silicon substrate and the gate oxide region of the transistor is small, and consequently the logic transistor has a high impedance. In other words, the further the lightly doped drain regions are formed outside the end sections of the logic transistor on both sides, the higher the impedance of the logic transistor becomes. To ensure that the logic transistor is sufficiently fast, the side wall oxide layer of the logic transistor should therefore be sufficiently thin (e.g. approx. 5 nm to 7 nm for the 130 nm technology generation). On the other hand, it is important for a side wall oxide layer to be present in a logic region, in order to form a well-defined surface at the side wall of the gate electrode made from polysilicon (polycrystalline silicon), in order to saturate surface charges as occur, for example, during the method of fabricating the logic transistor and to anneal plasma etching damage as may occur, for example, during the CVD (chemical vapor deposition) process which is frequently used in the fabrication of transistors.

On the other hand, it is aimed for the side wall oxide layer of a memory transistor in a flash memory or an EEPROM memory to be a sufficiently thick side wall oxide layer. A sufficiently thick side wall oxide layer ensures in a charge-storage layer that the information which is stored in the memory transistor and is coded in the amount of electric charge contained in the charge-storage layer is reliably retained. This leads to a sufficiently long hold time for the stored information, which is essential for the functionality of a memory transistor. Furthermore, a thick side wall oxide layer in a memory transistor leads to the avoidance of ion damage at the tunnel oxide edge, which adversely affects the functionality of a memory transistor, and to the avoidance of undesirable charging of the floating gate by subsequent implantations of ions for forming doped regions in surface regions of a substrate. Furthermore, a sufficiently thick side wall oxide layer keeps boundary charges caused by a silicon nitride spacer which is often formed during fabrication of the memory transistor away from the floating gate or from the gate oxide layer, thus ensuring perfect functionality of the memory transistor. The thickness of the side wall oxide in a memory transistor should be at least 10 nm.

The contradictory demands imposed on the thicknesses of the side wall oxide layers in a logic transistor and in a memory transistor on a chip which has both a logic region with rapid integrated logic for driving the memory region and a memory region with a multiplicity of memory transistors are often only taken into account in the prior art to the extent that a uniform thickness is selected for the side wall oxide layers of the logic transistors and the memory transistors. This uniform thickness is selected to be sufficiently small to obtain a logic transistor with a side wall thickness which is reasonably acceptable in the logic region and is also selected to be sufficiently great to obtain a memory transistor with a reasonably acceptable side wall thickness in the memory region. However, this compromise solution adversely affects the functionality of both types of transistors for the reasons listed above.

A compromise solution of this type is increasingly unsuitable for technologies which deal with transistors with a gate region length of 130 nm and below, if perfect functionality of the integrated circuits which these technologies produce is to be ensured. For a transistor with a gate region length of 130 nm and below, a side wall oxide thickness of significantly less than 10 nm is required for a perfectly functioning, sufficiently fast logic transistor, but this thickness is much too low for a memory transistor in a flash memory or an EEPROM.

The prior art has disclosed a method which makes it possible to fabricate an integrated circuit having a logic region with a logic transistor and a memory region with a memory transistor integrated on a common chip and in which the side wall oxide of the logic transistor and of the memory transistor can be formed in different thicknesses.

A method of this type, which involves the formation of logic transistors with a side wall oxide which is thinner than the side wall oxide of memory transistors formed on the same integrated circuit is described below with reference to FIGS. 1A-1I.

In the abovementioned figures, a left-hand region of the layer structures shown in each case represents a logic region of an integrated circuit (or more specifically a logic transistor of the logic region), and the region shown on the right-hand side represents a memory region (or more specifically a memory transistor of the memory region) of the integrated circuit. This is visually indicated in FIGS. 1A-1I by the fact that a dashed vertical line is included in the drawing, separating the logic region formed to the left of the dashed line from the memory region shown to the right of the dashed line.

To arrive at the layer structure 100 shown in FIG. 1A, a first silicon dioxide layer 102, a first polysilicon layer 103 and an ONO layer sequence 104 are deposited on a silicon substrate 101. An ONO layer sequence is a three-layer sequence comprising in each case one layer of silicon dioxide, silicon nitride and silicon dioxide. The first of the silicon dioxide layers of the ONO layer sequence 104 is deposited on the first polysilicon layer 103, the silicon nitride layer of the ONO layer sequence 104 is deposited on the first silicon dioxide layer of the ONO layer sequence 104, and the second silicon dioxide layer of the ONO layer sequence 104 is deposited on the silicon nitride layer of the ONO layer sequence 104.

The layer structure 105 shown in FIG. 1B is obtained by removing the first silicon dioxide layer 102, the first polysilicon layer 103 and the ONO layer sequence 104 from the entire logic region using a lithography process and an etching process.

To convert the layer structure 105 shown in FIG. 1B into the layer structure 106 shown in FIG. 1C, a second silicon dioxide layer 107, a second polysilicon layer 108 and a suitable hard mask 109 are deposited over the entire surface of the layer structure 105.

The layer structure 110 shown in FIG. 1D is obtained by the layer structure being patterned in the memory region (i.e. in the region to the right of the dashed line in FIG. 1C, FIG. 1D), whereas the logic region (region to the left of the dashed line in FIG. 1C, FIG. 1D) is covered. Since the structures formed in the memory region must lie within a small structural tolerance range, this patterning step is of crucial importance. This means that even slight inaccuracies in this method step will have a considerable influence on the functionality of the integrated circuit fabricated in this way. Therefore, this method step requires accurate setting of the process conditions, making this method step complex and expensive. As shown in FIG. 1D, only the top five layers are patterned in the memory region, whereas the first silicon dioxide layer 102 is retained in the memory region as well. This can be achieved by using a suitable etching process which is set up in such a manner that the etching process stops before the first silicon dioxide layer 102.

To achieve the layer structure 111 shown in FIG. 1E, the laterally delimited layer sequence which remains in the memory region after the patterning is covered with a first side wall oxide layer 112. This side wall oxide initially also grows on surface regions other than the laterally delimited layer sequence, including over the layers 102 and 109, and can be etched back, resulting in the layer sequence 111 shown in FIG. 1E. This leads to only a slight raising of the hard mask layer 109 (not shown) in the entire logic region during this method step. In other words, the side wall of the laterally delimited layer sequence in the memory region is covered with the first side wall oxide layer 112, whereas the logic region remains virtually unchanged.

The layer structure 113 shown in FIG. 1F is obtained by keeping the logic region covered while doping atoms are introduced into those surface regions of the silicon substrate 101 which are not covered by the laterally delimited layer sequence, using an ion implantation method, with the result that the LDD (lightly doped drain) regions 114a, 114b are formed.

To achieve the layer structure 115 shown in FIG. 1G, the memory region is then completely covered and the logic region is patterned using a lithography process and an etching process. To pattern the logic region into a laterally delimited layer sequence, a further patterning step of crucial importance is required. This means that even slight fluctuations in the procedure will immediately have an adverse effect on the functionality of the logic regions formed in this way. As with the first critical patterning step described above, this method step too requires a complex and expensive procedure which needs to be highly accurate. As shown in FIG. 1G, only the top two layers, namely the second polysilicon layer 108 and the hard mask 109, are patterned, whereas the second silicon dioxide layer 107 is not removed from the surface of the layer structure arranged in the logic region as a result of a suitable etching process being used. Consequently, the laterally delimited layer sequence which is shown in FIG. 1G and comprises the second polysilicon layer 108 and the hard mask 109 remains in place on the logic region.

The layer structure 116 shown in FIG. 1H is obtained by in each case applying a second side wall oxide layer 117 to the laterally delimited layer sequences in both the logic region and in the memory region of the flash memory or EEPROM. This is achieved by thermal oxidation of the side walls. The second side wall oxide layer 117 has a lower thickness than the first side wall oxide layer 112. As shown in FIG. 1H, the laterally delimited layer sequence in the logic region therefore includes a side wall oxide which corresponds to the thickness of the second side wall oxide layer 117, whereas the laterally delimited layer sequence in the memory region includes a side wall oxide layer whose thickness is composed of the thickness of the first side wall oxide layer 112 and the thickness of the second side wall oxide layer 117.

To achieve the layer structure 118 shown in FIG. 1I, implantation steps are carried out in both the logic region and the memory region, with the result that the first doped region 119a and the second doped region 119b are obtained in the logic region. In this way, the first HDD region 120a and the second HDD region 120b are produced in the memory region at the end sections of the laterally delimited layer sequences on both sides. HDD means highly doped drain, expressing the fact that the concentration of doping atoms in the HDD regions 120a, 120b is greater than in the LDD regions 114a, 114b. The laterally delimited layer sequence formed in the logic region forms a transistor with a side wall oxide having the thickness of the second side wall oxide layer 117. The first doped region 119a represents the first source/drain region, whereas the second doped region 119b forms the second source/drain region. The second silicon oxide layer 107 in the logic region forms the gate oxide layer, and the second polysilicon layer 108 forms the gate electrode in the logic region. The second side wall oxide layer 117 is used to laterally shield the transistor, and the hard mask 109 is likewise used as a protective layer.

The laterally delimited layer sequence formed in the memory region can be used as a memory transistor. The first LDD region 114a and the first HDD region 120a form the first source/drain region, the second LDD region 114b and the second HDD region 120b form the second source/drain region. The first silicon dioxide layer 102 constitutes the gate oxide region. The first polysilicon layer 103 can fulfill the functionality of a floating gate into which charge carriers can be permanently injected, for example by means of Fowler-Nordheim tunneling or by means of hot electrons. The ONO layer sequence 104 and the second silicon dioxide layer 107 effect electrical decoupling of the floating gate from the second polysilicon layer 108, which can perform the functionality of a gate electrode. The hard mask 109 represents a protective layer, and a sufficiently thick side wall oxide layer of the memory transistor is produced by means of the first side wall oxide layer 112 and the second side wall oxide layer 117.

However, the above-described method for forming logic transistors and memory transistors with different side wall oxide thicknesses has a number of drawbacks. As described above, two critical lithography steps are required during the method, and even slight deviations in these steps lead to wide-ranging negative consequences for the functionality of the arrangement. The execution of these two critical lithography steps makes fabrication of the layer structure 118 complex and expensive.

A further drawback of the fabrication method described is based on the fact that the gate patterning of the logic transistors, on the one hand, and of the memory transistors, on the other hand, are carried out in two separate method steps. The patterning of the memory transistors takes place in the method step in which the layer structure 110 shown in FIG. 1D is formed from the layer structure 106 shown in FIG. 1C. By contrast, the patterning of the logic transistors takes place in the method step in which the layer structure 115 shown in FIG. 1G is formed from the layer structure 113 shown in FIG. 1F. In practice, it is not possible to set absolutely identical conditions for these two method steps. However, it is important to provide structures with a homogenous surface coverage density in the logic region, on the one hand, and in the memory region, on the other hand. The surface coverage density is defined as the ratio of the sum of the areas which are covered in the logic or memory region divided by the total surface area of the logic region or of the memory region. The surface coverage density should ideally be as homogenous as possible over the entire chip, in order to be able to ensure minimal tolerances during fabrication of the gate electrodes.

If the surface coverage densities achieved by the two above-described method steps for patterning of the logic transistors, on the one hand, and the memory transistors, on the other hand, deviate from one another, the result will be a variation in the geometry of the gate electrode. Adverse effects which result from an uneven surface coverage density are referred to as etch loading effects. These have an adverse effect on the functionality of the integrated circuit formed. Therefore, the quality of the transistors which are fabricated using the method described is often poor.

U.S. Pat. No. 5,291,052 discloses a CMOS semiconductor device with a p-MOS transistor and with an n-MOS transistor on a wafer.

U.S. Pat. No. 6,160,317 discloses a method for fabricating a semiconductor device which allows etching of a field oxide while minimizing damage to the silicon.

German Patent No. DE 196 54 738 A1 discloses a method for fabricating a semiconductor memory device with n-MOS and p-MOS transistors with different properties.

Great Britain Patent No. GB 2,359,662 discloses a semiconductor device with a DRAM cell.

Accordingly, there is an need to overcome the problem of providing laterally delimited layer sequences with different side wall thicknesses on a common substrate with a reduced level of outlay and in an improved quality.

SUMMARY

The present invention is defined by the following claims, and nothing in this section should be taken as a limitation on those claims. By way of introduction, the preferred embodiments described below relate to a method for fabricating a layer arrangement, by a layer arrangement and by a memory arrangement.

A method is provided for fabricating a layer arrangement in which at least one first layer sequence, which is in each case laterally delimited, is formed on a first surface region of a substrate, and at least one second layer sequence, which is in each case laterally delimited, is formed on a second surface region of the substrate. Furthermore, in each case one first side wall layer having a first thickness and comprising a first electrically insulating material is formed on at least one sub-region of the side walls of the first and second layer sequences. Furthermore, in each case one second side wall layer having a second thickness and comprising a second electrically insulating material is formed on at least one sub-region of the first side wall layers of the first and second layer sequences. Then, the second side wall layers are removed from the first layer sequences.

This clearly allows the procedure to be simplified in particular when gate electrodes with different side wall oxide thicknesses are being fabricated.

The first layer sequence on the first surface region of the substrate may be a logic transistor of a logic circuit, and the second layer sequence may be a memory transistor in a memory region of an integrated circuit. In the layer arrangement which has been fabricated in accordance with the disclosed embodiments, the thickness of the side wall oxide of the first laterally delimited layer sequence (layer having the first thickness) is less than the thickness of the side wall layer on the second laterally delimited layer sequence (layer having the first thickness plus layer having the second thickness). On account of the low thickness of the side wall oxide, the first layer sequence, which preferably forms a logic transistor in the logic region of an integrated circuit, has a sufficiently low connection resistance and ensures a sufficiently fast logic. By contrast, the second layer sequence has a thicker side wall layer, resulting in a number of advantageous effects: a memory transistor with a high side wall oxide thickness has a sufficiently long hold time for the stored information, and furthermore a sufficiently thick side wall oxide layer provides good protection for a memory transistor against any disruptive influence from its surroundings.

According to an advantageous configuration of the method, the formation of at least one first layer sequence, which is in each case laterally delimited, on the first surface region of the substrate and the formation of the at least one second layer sequence, which is in each case laterally delimited, on the second surface region of the substrate includes the following sub-steps:

In a first sub-step, a first, electrically insulating auxiliary layer is formed on the first and second surface regions of the substrate, a second, electrically conductive auxiliary layer is formed on the first, electrically insulating auxiliary layer, and a third, electrically insulating auxiliary layer is formed on the second, electrically conductive auxiliary layer. In a second sub-step, the first, second and third auxiliary layers are removed from the first surface region of the substrate. In a third sub-step, a fourth, electrically insulating auxiliary layer is formed on the first and second surface regions of the substrate (or more specifically on the surface of the layer structure as obtained after the second sub-step), a fifth, electrically conductive auxiliary layer is formed on the fourth, electrically insulating auxiliary layer, and a sixth, electrically insulating auxiliary layer is formed on the fifth, electrically conductive auxiliary layer. In a fourth sub-step, the fifth and sixth auxiliary layers on the first and second surface regions are jointly patterned in such a manner that the at least one laterally delimited first layer sequence is formed on the first surface region. In a fifth sub-step, the second, third and fourth auxiliary layers on the second surface region are patterned in such a manner that as a result the at least one second layer sequence, which is in each case laterally delimited, is formed on the second surface region.

It should be emphasized that in the fourth sub-step the fifth and sixth auxiliary layers on the first and second surface regions are patterned together. In other words, in this sub-step, the layer sequences which have been deposited on the surface region are patterned in such a manner that as a result the lateral delimitation of the first and second layer sequences is defined in a common method step. In other words, referring to a preferred exemplary embodiment in which the first layer sequences are logic transistors and the second layer sequences are memory transistors of an integrated circuit, both the logic transistors and the memory transistors are structurally defined in a single, common critical lithography step. This eliminates the need for one critical lithography step compared to the method described above with reference to FIGS. 1A-1I for the formation of logic transistors and memory transistors with different side wall thicknesses, and consequently the method for fabricating logic transistors and memory transistors with different side wall thicknesses is significantly simplified. As a result, the fabrication costs are reduced and the work involved is also reduced.

Furthermore, the fact that the logic transistors and the memory transistors are patterned together means that etch loading effects resulting from inhomogeneous surface coverage densities on different surface regions of the substrate (cf. description above) are reduced. Obviously, the uniformity of the surface coverage density of the first and second layer sequences is improved, since the method parameters used to form the first and second layer sequences are identical on account of a common lithography step being used. Significant parameters of the layer sequences, for example the length of the gate oxide region of the MOS transistors, are therefore identical for the logic transistors and memory transistors, with the result that an integrated circuit with logic region and memory region which has been fabricated using the disclosed method is of improved quality compared to the prior art.

According to an advantageous configuration of the fabrication disclosed method, doping atoms are introduced into surface regions which adjoin the lateral end sections of the second layer sequences between the step of forming the second side wall layer having the second thickness and comprising the second electrically insulating material on at least one sub-region of the first side wall layers of the first and second layer sequences, on the one hand, and the step of removing the second side wall layers from the first layer sequences, on the other hand.

In other words, in this method step LDD regions are formed in those surface regions of the substrate which adjoin the lateral edge regions of the second layer sequences. The objective of this method step is to form the first or second source/drain region of the second layer sequences in a situation in which the second layer sequences are memory transistors.

According to a refinement of the disclosed method, after the removal of the second side wall layers from the first layer sequences, doping atoms are introduced into surface regions of the substrate which are spatially decoupled from the lateral edge sections of the second layer sequences and which partially overlap one of the surface regions of the substrate into which doping atoms have been introduced.

This method step represents the step of forming HDD (highly doped drain) regions which are formed to overlap the LDD (lightly doped drain) regions described above. The concentration of the doping atoms is lower in the LDD regions than in the HDD regions. The doping atoms may be n-type doping atoms or p-type doping atoms.

According to a further configuration, doping atoms are introduced into surface regions of the substrate which adjoin lateral edge sections of the first layer sequences after the second side wall layers have been removed from the first layer sequences.

As described above, the first layer sequences are used in particular as logic transistors in a logic region of an integrated circuit. In the method step described, the first source/drain region and the second source/drain region of the logic transistors are formed. The doping atoms which are introduced into surface regions of the substrates which adjoin the lateral edge regions of the first layer sequence in this step may be n-doping atoms or p-doping atoms.

The method steps described can all be implemented using standardized semiconductor technology processes, such as the ion implantation process, known lithography processes and known etching processes, and known deposition processes, such as for example the CVD (chemical vapor deposition) process. Therefore, the disclosed fabrication method is inexpensive and technologically simple.

According to another method for fabricating a layer arrangement, at least one first layer sequence, which is in each case laterally delimited, is formed on a first surface region of a substrate, and at least one second layer sequence, which is in each case laterally delimited, is formed on a second surface region of the substrate. Furthermore, in each case a first side wall layer having a first thickness and comprising a first electrically insulating material is formed on at least one sub-region of the side walls of the first and second layer sequences. Furthermore, an auxiliary side wall layer is formed on at least one sub-region of the first side wall layers of the first layer sequence, and a second side wall layer having a second thickness and comprising a second electrically insulating material is formed on at least one sub-region of the first side wall layer of the second layer sequence. The material used for the auxiliary side wall layer is selected in such a manner that while the second side wall layer is being formed on at least one sub-region of the first side wall layer of the second layer sequence, the auxiliary side wall layer remains uncovered by the second electrically insulating material.

Evidently, the first layer sequence is protected from being covered by the second side wall layer by the application of the auxiliary side wall layer. After the second side wall layer has been applied to the second layer sequence, the auxiliary side wall layer can be removed, with the result that only the first side wall layer remains on the side wall of the first layer sequence, while the first and second side wall layers remain on the side wall of the second layer stack.

After the second side wall layer has been formed, it is preferable for the auxiliary side wall layer to be removed from the first layer stack.

According to a preferred configuration, the second side wall layer is formed by means of thermal oxidation of at least part of the material of the second laterally delimited layer sequence. As a result of a suitable selection of materials, this thermal oxidation clearly acts "through" the first side wall layer. During the thermal oxidation, the auxiliary side wall layer evidently protects the first layer sequence from thermal oxidation.

It is preferable for the first and second electrically insulating materials to be silicon dioxide and for the material of the auxiliary side wall layer to be silicon nitride.

The disclosed layer arrangement is described in more detail below. Configurations of the layer arrangement also apply to the methods used to fabricate a layer arrangement.

The disclosed layer arrangement has a substrate, at least one first layer sequence, which is in each case laterally delimited, on a first surface region of the substrate, at least one second layer sequence, which is in each case laterally delimited, on a second surface region of the substrate, in each case one first side wall layer having a first thickness and comprising a first electrically insulating material on at least one sub-region of each of the side walls of each of the first and second layer sequences, and in each case one second side wall layer having a second thickness and comprising a second electrically insulating material on at least one sub-region of each of the first side wall layers of each of the second layer sequences.

In particular, the first thickness may be less than the second thickness. The first thickness is preferably between 5 nm and 7 nm, whereas the second thickness is preferably approximately 10 nm or above.

The substrate is preferably a silicon substrate, such as for example a silicon wafer or a silicon chip.

An insulation layer comprising a third electrically insulating material may be arranged between the substrate and at least part of the first and/or second layer sequence.

Referring now to the use of the disclosed layer arrangement as a logic region (first layer sequences) and memory region (second layer sequences), it is possible for the insulation layer arranged between the layer sequences and the substrate to form the gate oxide layer of the transistors formed by the layer sequences.

According to an advantageous configuration of the layer arrangement according to the disclosed embodiments, the first layer sequence includes a first part-layer comprising a first electrically conductive material and a second part-layer comprising a fourth electrically insulating material.

The second layer sequence preferably includes a charge-storage part-layer, a second part-layer comprising a fifth, electrically insulating material, a third part-layer comprising a second, electrically conductive material and a fourth part-layer comprising a sixth, electrically insulating material.

In particular, the charge-storage part-layer may be a layer comprising polycrystalline silicon with a silicon dioxide-silicon nitride-silicon dioxide layer sequence (ONO layer) as covering layer. Alternatively, the charge-storage part-layer may be a silicon dioxide-silicon nitride-silicon dioxide layer sequence (ONO layer).

The two alternatives described correspond to two different concepts of memory transistors, namely memory transistors based on the floating gate principle and memory transistors having an ONO layer as charge-storage layer. Both floating gate memory transistors and ONO-layer memory transistors can be used as second layer sequences of the layer arrangement.

In the case of an ONO memory transistor, the gate oxide layer is replaced by an ONO layer (silicon dioxide-silicon nitride-silicon dioxide), and charge carriers can be injected into the ONO layer (or more specifically into the silicon nitride layer of the ONO layer), where they remain permanently, by means of channel hot electron (CHE) injection. The gate region of an ONO transistor has a different electrical conductivity depending on the number of electrons introduced into the ONO layer. In this way, the memory information is coded in the ONO layer.

By contrast, in the case of a floating gate memory transistor, a layer comprising an electrically conductive material, e.g. polycrystalline silicon, and a sufficiently thick layer comprising an electrically insulating material are introduced between the gate electrode and the gate oxide layer. Charge carriers, whose presence changes the electrical conductivity of the channel region below the gate oxide between the source region and the drain region of a transistor of this type, are injected into the electrically conductive layer above the gate oxide layer by means of Fowler-Nordheim tunneling or by means of hot charge carriers as a result of a sufficiently high electric voltage being applied between the gate electrode and the source/drain regions. The value of this conductivity codes the information stored in the floating gate memory transistor.

The layer arrangement which is provided in accordance with the disclosed embodiments has the advantage that the second layer sequences which it includes can optionally be configured as floating gate transistors, as ONO transistors or as a different type of memory transistor. Therefore, the disclosed layer arrangement can easily and flexibly be matched to the requirements of the specific application.

The first and/or second electrically conductive material is preferably polycrystalline silicon.

The first, second, third, fourth, fifth and sixth electrically insulating materials may be silicon dioxide or silicon nitride or a silicon dioxide-silicon nitride-silicon dioxide layer sequence (ONO layer).

In other words, an ONO layer can be used not only, as described above, as a layer for storing charge carriers, the number of which codes the logic information stored in a memory transistor, but also as a layer with electrically insulating properties, for example for decoupling two electrically conductive regions.

Finally, a memory arrangement is provided having a layer arrangement with the features given in the above description. In the memory arrangement, the at least one first layer sequence on the first surface region of the substrate forms at least part a of the logic region of the memory arrangement, whereas the at least one second layer sequence on the second surface region of the substrate forms at least a part of the memory cell region of the memory arrangement.

To summarize, the demand is satisfied for side wall oxide layers of different thicknesses in logic transistors and in memory transistors in a common integrated circuit which can be fabricated using only one critical gate patterning step. Therefore, the method for fabricating a layer arrangement of this type is significantly simpler and less expensive than the method which is known from the prior art. Furthermore, the method achieves a homogenous surface coverage, which has advantageous effects on the reproducibility and quality of the gate patterning. Moreover, etch loading effects are avoided as a result.

Clearly, one aspect can also be considered to lie in the fact that both the first layer sequences and the second layer sequences are covered with a thin side wall oxide layer, and then the first and second layer sequences are covered with a second, preferably thicker side wall oxide layer, which second side wall oxide layer is then removed from the logic region Further aspects and advantages of the invention are discussed below in conjunction with the preferred embodiments.

BRIEF DESCRIPTION OF THE DRAWINGS

FIGS. 1A-1I show cross-sectional views through layer structures at different times during a fabrication method according to the prior art, FIGS. 2A-2J show cross-sectional views through layer structures at different times during a fabrication method in accordance with a preferred exemplary embodiment of the method according to the invention for fabricating a layer arrangement, FIGS. 3A-3E show cross-sectional views through layer structures at different times during a fabrication method according to another preferred exemplary embodiment of the method according to the invention for fabricating a layer arrangement.

DETAILED DESCRIPTION OF THE DRAWINGS AND PRESENTLY PREFERRED EMBODIMENTS

Figure 1A:
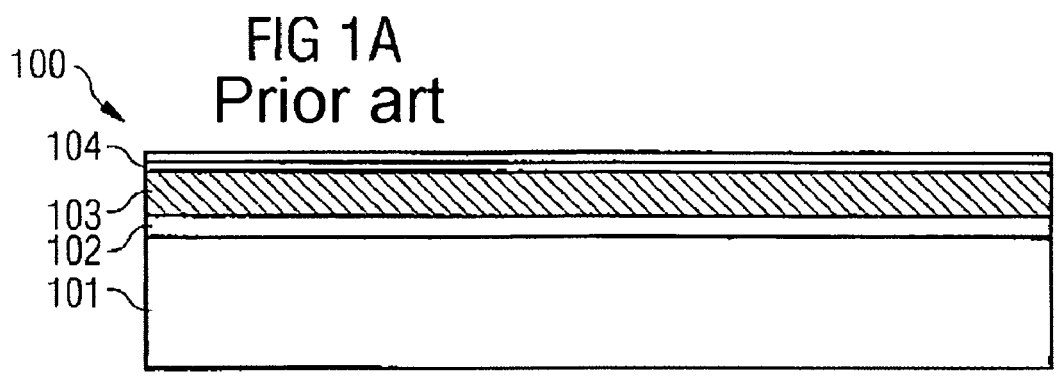
Figure 1B:
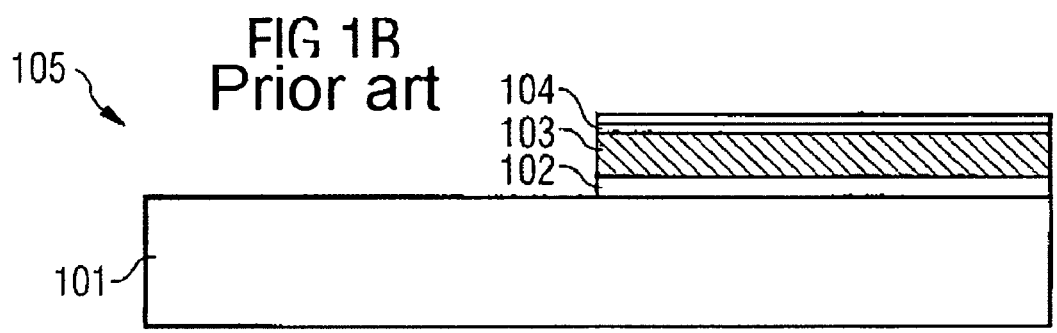
Figure 1C:
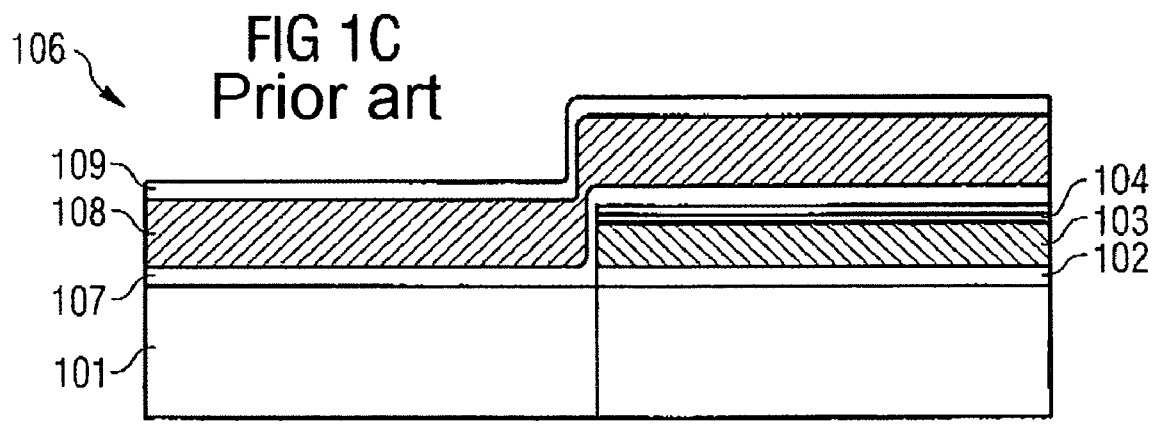
Figure 1D:
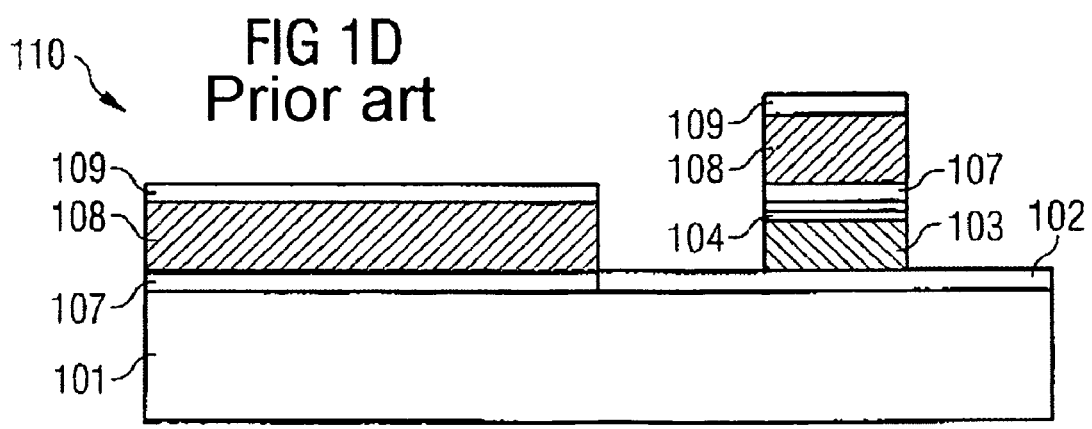
Figure 1G:
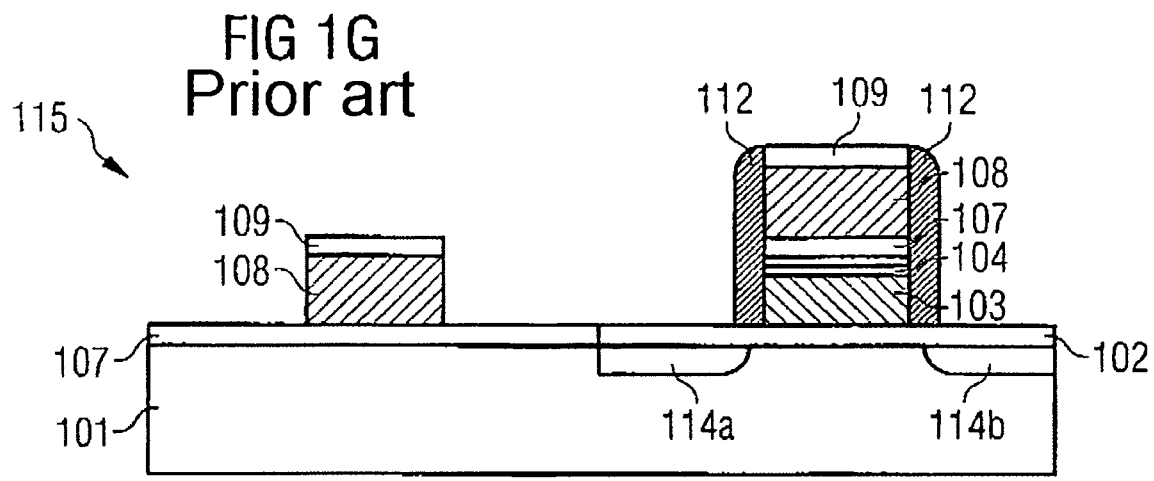
Figure 1H:
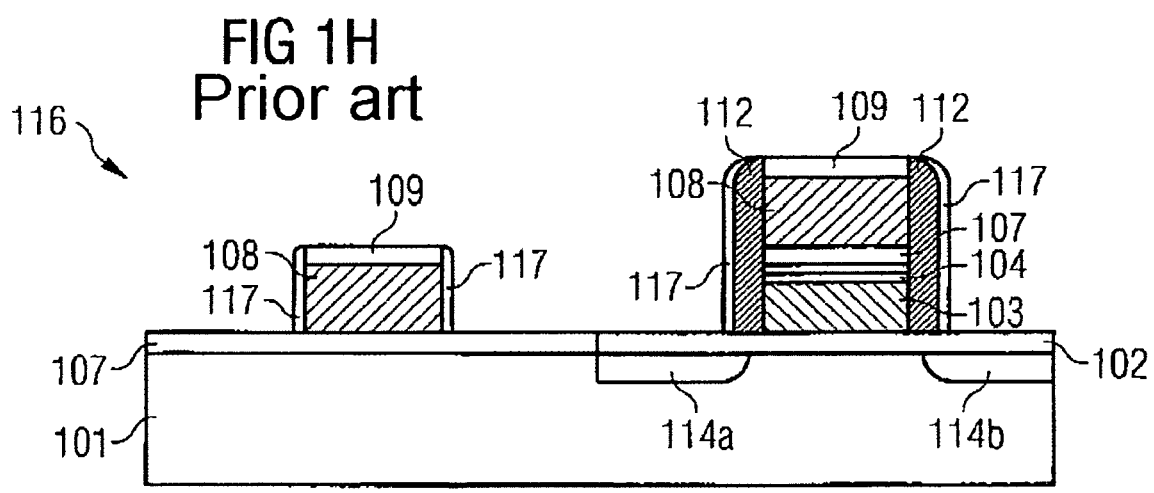
Figure 1I:
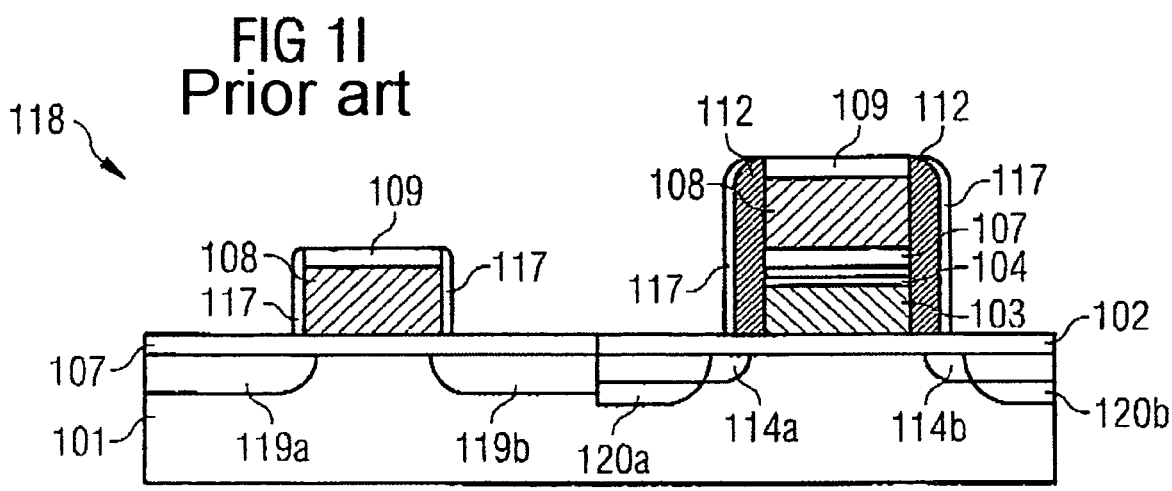

The text which follows, referring to FIG. 2A to FIG. 2J, describes a preferred exemplary embodiment of the method for fabricating a layer arrangement.

FIG. 2A to FIG. 2J each include a dashed vertical separation line. This separates a first surface region 201a of a substrate 201, which is in each case shown to the left-hand side of the dividing line and on which first layer sequences are produced to form logic transistors, from a second surface region 201b of the substrate 201, which is in each case shown to the right of the dividing line and on which second layer sequences are formed to produce memory transistors. To simplify explanation, only one first layer sequence on the first surface region 201a and only one second layer sequence on the second surface region 201b are shown in the figures. In practice, there will often in each case be a large number of layer sequences on the corresponding surface regions 201a, 201b.

The layer structure 200 shown in FIG. 2A is obtained by a first silicon dioxide layer 202 being formed on a first surface region 201a and on a second surface region 201b of a silicon wafer 201, a first polysilicon layer 203 being formed on the first silicon dioxide layer 202 and an ONO layer 204 being formed on the first polysilicon layer 203. The ONO layer 204 includes a silicon dioxide part-layer 204a, a silicon nitride part-layer 204b and a further silicon dioxide pail-layer 204c. The silicon dioxide part-layer 204a of the ONO layer 204 is formed on the first polysilicon layer 203, the silicon nitride part-layer 204b is formed on the silicon dioxide part-layer 204a and the further silicon dioxide part-layer 204c is formed on the silicon nitride part-layer 204b.

In accordance with the exemplary embodiment described, the first silicon dioxide layer 202, the first polysilicon layer 203 and the ONO layer 204 are formed using thermal oxidation or CVD (chemical vapor deposition) processes.

To produce the layer structure 205 shown in FIG. 2B, the first silicon dioxide layer 202, the first polysilicon layer 203 and the ONO layer 204 are removed from the first surface region 201a of the silicon wafer 201.

In accordance with the exemplary embodiment described, this method step is carried out by using a suitable mask to cover the second surface region of the layer structure 200 and then using a lithography process and an etching process to remove the first silicon dioxide layer 202, the first polysilicon layer 203 and the ONO layer 204 from the first surface region 201a of the layer structure 200. The first surface region 201a represents what will subsequently be the logic region, whereas the second surface region 201b forms what will subsequently be the memory region of an integrated circuit. It should be emphasized that the lithography process step which is required to convert the layer structure 200 into the layer structure 205 is not critical, i.e. slight structural inaccuracies when the lithography process is carried out do not have any serious consequences for the functionality of the integrated circuit obtained. Therefore, this method step is relatively simple.

To produce the layer structure 206 shown in FIG. 2C, a second silicon dioxide layer 207 is deposited on the first and second surface regions 201a, 201b of the silicon wafer 201 (more specifically, this layer is not deposited on the second surface region 201b itself, but rather on the surface of the topmost of the layers arranged on the second surface region 201b), a second polysilicon layer 208 is deposited on the second silicon dioxide layer 207, and a silicon nitride hard mask 209 is deposited on the second polysilicon layer 208.

These method steps are likewise carried out using the CVD process, i.e. the layers 207, 208, 209 are deposited from the vapor phase.

The layer structure 210 shown in FIG. 2D is obtained by the second polysilicon layer 208 and the silicon nitride hard mask 209 on the first and second surface regions 201a, 201b being patterned jointly in such a manner that a laterally delimited, first layer sequence 212 is formed on the first surface region. As a result, a laterally delimited auxiliary layer sequence 213a is formed on the second surface region 201b.

To implement this method step, a lithography process and an etching process are applied to the entire surface of the layer structure 206. Since these lithography processes and this etching process form laterally delimited structures, the size of which is extremely small (of the order of magnitude of 100 nm and below), this lithography step is critical. This means that even slight errors in this method step will have a significant effect on the functionality of the integrated circuit which is fabricated. Therefore, particular attention is required in this method step. It should be emphasized that this method step represents the only critical lithography step in the disclosed fabrication method. The fact that the same process conditions are present when the laterally delimited regions 212, 213a in the first and second surface regions are being formed means that fluctuations in the physical parameters of the structures formed are avoided. In particular, the surface coverage density is homogenous.

To convert the layer structure 210 shown in FIG. 2D into the layer structure 211 shown in FIG. 2E, the first polysilicon layer 203, the ONO layer 204 and the second silicon dioxide layer 207 on the second surface region 201b of the silicon wafer 201a re patterned in such a manner that as a result a second layer sequence 213, which is in each case laterally delimited, is formed on the second surface region 201b.

In this lithography method step, which is not critical, the first surface region 201a, which will subsequently form the logic region, has been covered with a mask. This means that the method step is applied only to the second surface region 201b of the layer structure 210. The patterning of the layers 203, 204, 207 on the second surface region 201b is carried out using a suitable etching process, which is selected in such a manner that the lateral delimitation of the auxiliary layer sequence 213a also defines the lateral delimitation during the etching-back of the layers 203, 204, 207 on the second surface region 201b. In other words, an anisotropic etch takes place in a vertical direction in accordance with FIG. 2E, with the result that the lateral delimitation defined by the auxiliary layer sequence 213a obviously continues downwards. Therefore, the lateral delimitation of the second laterally delimited layer sequence 213 is determined by the critical lithography step described above.

The method steps which have been described with reference to FIG. 2A to FIG. 2E can be combined to an extent which is such that a laterally delimited first layer sequence 212 on the first surface region 201a of the silicon wafer 201 and a laterally delimited second layer sequence 213 on the second surface region 201b of the silicon wafer 201a re formed.

To convert the layer structure 211 shown in FIG. 2E into the layer structure 214 shown in FIG. 2F, in each case a first silicon dioxide side wall layer 215 having a first thickness d1 is formed on the side walls of the first layer sequence 212 and of the second layer sequence 213.

According to the exemplary embodiment described, this method step is carried out by thermal oxidation of the side walls of the first laterally delimited layer sequence 212 and of the second laterally delimited layer sequence 213. Thermal oxidation means that an oxygen atmosphere is generated in the process chamber and the reactivity of the oxygen is increased by raising the temperature. As a result, the side walls of the laterally delimited layer sequences 212, 213 which include silicon are oxidized to form silicon dioxide. The result is a first silicon dioxide side wall layer 215, the first thickness d1 of which is approximately 5 nm.

The layer structure 216 shown in FIG. 2G is obtained by in each case forming a second silicon dioxide side wall layer 217 having a second thickness d2 on the first silicon dioxide side wall layers 215 of the first layer sequence 212 and of the second layer sequence 213.

In accordance with the described preferred exemplary embodiment of the method for fabricating a layer arrangement, the second silicon dioxide side wall layer 217 is made from silicon dioxide. The second silicon dioxide side wall layer 217 is applied to the first silicon dioxide side wall layers 215 using the CVD process.

According to the exemplary embodiment described, the second thickness d2 is greater than the first thickness d1, i.e. d2>d1.

It should be emphasized that as an alternative to the exemplary embodiment described, the second side wall layers may also be made from silicon nitride material, which can likewise be applied to the first silicon dioxide side wall layers 215 by means of a CVD process.

According to the exemplary embodiment described, the second silicon dioxide side wall layers 217 are formed on the first silicon dioxide side wall layers 215 using a special CVD process, known as the TEOS (tetraethyl orthosilicate) process. To achieve a high wet-etching rate of the second silicon dioxide side wall layers 217, it is preferable to use a LPCVD (low pressure chemical vapor deposition) process. It should be emphasized that a thermally grown silicon dioxide layer, such as the first silicon dioxide side wall layer 215, on the one hand, and a silicon dioxide layer which is applied using the TEOS CVD process, in particular using the TEOS LPCVD process, (such as the second silicon dioxide side wall layer 217), on the other hand, have different physical properties, in particular in terms of their interaction with etching chemicals.

To achieve the layer structure 218 shown in FIG. 2H, doping atoms are introduced into those surface regions of the silicon substrate 201 which adjoin the lateral end sections of the second layer sequence 213, with the result that the LDD regions 219 are formed.

According to the described exemplary embodiment of the method for fabricating a layer arrangement, this method step is carried out using an ion implantation process. This is understood as meaning the introduction of foreign atoms into the surface of a solid body by bombarding the solid body with accelerated ions. By means of ion implantation, it is possible to influence the electrical properties of the semiconductor material, in particular to increase the electrical conductivity. The ions are fired onto the second surface region 201b of the layer structure 216 with a predetermined energy and penetrate into the substrate in its boundary regions with respect to the second laterally delimited layer sequence 213. As shown in FIG. 2H, this results in LDD regions 219, which according to the exemplary embodiment described are n-doped. These regions are provided for the purpose of forming part of the source/drain regions of what will subsequently be the memory transistor. The concentration of the doping atoms in the LDD (lightly doped drain) regions 219 is referred to below as the first charge carrier density.

To convert the layer structure 218 shown in FIG. 2H into the layer structure 220 shown in FIG. 2I, the second silicon dioxide side wall layer 217 is removed from the first laterally delimited layer sequence 212.

For this purpose, the sub-region of the layer structure 218 to the right of the dashed line, i.e. the region of the memory transistors, is covered with a mask, whereas the region to the left of the dashed line, i.e. the logic region, is treated using a wet-chemical etching process. This patterning step is once again not critical. The second silicon dioxide side wall layer 217 is removed from the first laterally delimited layer sequences 212 using a suitable wet-chemical etching process, with the result that only the first silicon dioxide side wall layer 215 remains in place on the side wall of the first laterally delimited layer sequences 212. The selectivity of the etching process is exploited in the wet-etching process. With regard to the material constellation of the layer structure 218, use is made of the fact that wet-chemical etching, using hydrofluoric acid (HF), of the second silicon dioxide side wall layer 217 formed using a CVD process has a significantly higher etching rate than the wet-chemical etching of the first silicon dioxide side wall layer 215 formed by means of thermal oxidation. The ratio of the etching rates of CVD silicon dioxide to thermally grown silicon dioxide in the case of wet-chemical etching using hydrofluoric acid is approximately ten to one. This ensures that the etching process is ended sufficiently reliably after the second silicon dioxide side wall layer 217 has been etched away, whereas undesirable further etching of the first silicon dioxide side wall layer 215 in the first laterally delimited layer sequence 212 is substantially avoided.

An alternative way of carrying out the disclosed method a for fabricating a layer arrangement should also be pointed out. In the method step described above with reference to FIG. 2G, in which the second silicon dioxide side wall layers 217 are formed on the first silicon dioxide side wall layers 215 of the first and second layer sequences 212, 214, as an alternative to silicon dioxide ($SiO_2$), it is also possible to use silicon nitride ($Si_3N_4$) as material for the second silicon dioxide side wall layers 217. In such a scenario, the first silicon dioxide side wall layer 215 is produced from thermally grown silicon dioxide, whereas the second side wall layer 217 is produced from silicon nitride which is applied to the first silicon dioxide side wall layer 215 using a suitable CVD process. In such a case, phosphoric acid ($H_3PO_4$) instead of hydrofluoric acid is a suitable chemical for the wet-chemical etching process by means of which the layer structure 220 shown in FIG. 2I is produced from the layer structure 218 shown in FIG. 2H. In this case, use is made of the fact that silicon nitride is etched at a significantly higher etching rate than silicon dioxide when phosphoric acid is used. The ratio of the wet-etching rates of silicon nitride which has been grown using a CVD process and silicon dioxide produced by means of thermal oxidation is greater than two to one. Therefore, if silicon nitride is used as material for the second side wall layer 217, the wet etch of the side wall of the first layer sequence 212 is guaranteed to stop with sufficient reliability after the second side wall layer 217 made from silicon nitride has been completely removed.

To convert the layer structure 220 shown in FIG. 2I into the layer arrangement 221 shown in FIG. 2J, doping atoms having a second charge carrier density are introduced into surface regions of the silicon wafer 201 which are spatially decoupled from the lateral end sections of the second laterally delimited layer sequence 213 and which partially overlap the LDD regions 219 of the silicon wafer 201. As a result, the HDD (highly doped drain) regions 222 are formed. Furthermore, doping atoms having a third charge carrier density are introduced into surface regions of the silicon wafer 201 which adjoin the lateral end sections of the first laterally delimited layer sequence 212, with the result that the doped regions 223 are formed.

According to the described exemplary embodiment of the fabrication method, the described method steps by means of which the layer arrangement 221 is obtained from the layer structure 220 are carried out by using an ion implantation process. It should be noted that the second charge carrier density of doping atoms in the HDD regions 222 is higher than the first charge carrier density of doping atoms in the first LDD regions 219. The HDD regions 222 or the doped regions 223 can be formed either in a common method step or in two separate method steps.

The product obtained from the described method for fabricating a layer arrangement is a preferred exemplary embodiment of the layer arrangement 221, having a silicon wafer 201, having a laterally delimited first layer sequence 212 on a first surface region 201a of the silicon wafer 201, having a laterally delimited second layer sequence 213 on a second surface region 201b of the silicon wafer 201, having a first silicon dioxide side wall layer 215 of thickness d1 on the side walls of the first and second layer sequences 212, 213 and having a second silicon dioxide side wall layer 217 of the second thickness d2 on the first silicon dioxide side wall layers 215 of the second laterally delimited layer sequence 213.

Between the silicon wafer 201 and the first laterally delimited layer sequence 212, the electrically insulating second silicon dioxide layer 207 is arranged on the first surface region 201a of the silicon wafer 201, and between the silicon wafer 201 and the second laterally delimited layer sequence 213 an electrically insulating first silicon dioxide layer 202 is arranged on the second surface region 201b of the silicon wafer 201. The second laterally delimited layer sequence 213 includes a charge-storage part-layer which is formed as a first polysilicon layer 203, the ONO layer 204, the second silicon dioxide layer 207, the second polysilicon layer 208 and the silicon nitride hard mask 209. The first laterally delimited layer sequence 212 includes the second polysilicon layer 208 and the silicon nitride hard mask 209.

The left-hand region of FIG. 2J can be used as a logic transistor of a logic region of an integrated circuit, whereas the right-hand region of the layer arrangement 221 from FIG. 2J can be used as a memory transistor of a memory region of an integrated circuit. The first laterally delimited layer sequence 212, together with the doped regions 223, forms a logic transistor which includes a side wall layer which is formed as a first silicon dioxide side wall layer 215 and has a sufficiently small thickness d1 for the logic transistor to be sufficiently fast and to have a sufficiently low connection resistance. In this case, the doped regions 223 function as first and second source/drain regions, the second silicon dioxide layer 207 functions as a gate oxide layer and the second polysilicon layer 208 functions as a gate electrode.

By contrast, the memory transistor in the right-hand region of the layer arrangement 221 shown in FIG. 2J, which is formed by the second laterally delimited layer sequence 213 and the LDD regions 219 and the HDD regions 222, includes a sufficiently thick side wall layer, which has been formed from the first silicon dioxide side wall layer 215 and the second silicon dioxide side wall layer 217, of approximate thickness d1+d2 and is therefore sufficiently reliably shielded from its surroundings. In the right-hand region of the layer arrangement 221, which is formed as a memory transistor, the LDD regions 219 and the HDD regions 222 function as first and second source/drain regions, the first silicon dioxide layer 202 functions as a gate oxide layer, the first polysilicon layer 203 functions as a charge-storage layer, into which electrical charge carriers can be injected permanently, for example by means of Fowler-Nordheim tunneling or hot electrons, the ONO layer 204 and the second silicon dioxide layer 207 function as an electrically insulating layer between the charge-storage layer 203 and the second polysilicon layer 208, the arrangement comprising the layers 204, 207 being sufficiently thick to ensure a sufficiently long hold time for the information stored in the first polysilicon layer 203, the second polysilicon layer 208 functions as a gate electrode and the silicon nitride hard mask 209 functions as a protective layer.

The text which follows, referring to FIGS. 3A to 3E, describes another preferred exemplary embodiment of the method for fabricating a layer arrangement.

According to the exemplary embodiment described below, the method steps which have been described with reference to FIG. 2A to FIG. 2F are identical to those used in the method which has been described with reference to FIG. 2A to FIG. 2J.

The layer structure 300 shown in FIG. 3A is obtained by, starting from the layer structure 214 shown in FIG. 2F, depositing a first auxiliary layer 301 comprising silicon nitride over the entire surface of the laterally delimited layer sequences of the logic region (on the left-hand side of the figure) and of the memory region (on the right-hand side of the figure). Then, by way of example, a second, silicon dioxide auxiliary layer 302 is deposited on the first, silicon nitride auxiliary layer 301.

To obtain the layer structure 303 shown in FIG. 3B, the left-hand surface region of the substrate 201, in accordance with FIG. 3B, is lithographically covered using a suitable mask, and the second, silicon dioxide auxiliary layer 302 and the first, silicon nitride auxiliary layer 301 are removed from the laterally delimited layer sequence on the right-hand side of FIG. 3B. The second, silicon dioxide auxiliary layer 302 is removed using a wet-chemical etching process. Then, the photoresist is removed from the surface of the layer structure and the first, silicon nitride auxiliary layer 301 is removed using a wet-chemical etching process employing hot phosphoric acid. The sub-region of the layer structure which is on the left-hand side of FIG. 3B, however, is protected against the first, silicon nitride auxiliary layer 301 being removed. This is based on the high selectivity achieved when etching with hot phosphoric acid, i.e. this chemical is effective at etching silicon nitride, whereas silicon dioxide is protected against being etched.

To obtain the layer structure 304 shown in FIG. 3C, the second silicon dioxide auxiliary layer 302 is removed from the surface region of the silicon substrate 201 which is on the left-hand side of FIG. 3C. This is achieved by using an etching process with dilute hydrofluoric acid, the high selectivity achieved when etching using hydrofluoric acid for silicon dioxide produced by means of thermal oxidation, on the one hand, and silicon dioxide produced, for example, using an ozone-activated deposition process, on the other hand, advantageously being employed. In other words, by using dilute hydrofluoric acid, it is possible to remove silicon dioxide, which has been applied using, for example, an ozone-activated deposition process and which has not yet been densified by means of a high-temperature process, with a high etching rate. By contrast, silicon dioxide produced by means of thermal oxidation is removed at a much lower etching rate when dilute hydrofluoric acid is used.

To obtain the layer structure 305 shown in FIG. 3D, a second silicon dioxide side wall layer 306 is formed on the laterally delimited layer sequence on the right-hand side of FIG. 3D by means of thermal oxidation. It should be noted that the laterally delimited layer sequence on the left-hand side of FIG. 3D is protected from thermal oxidation, since the first, silicon nitride auxiliary layer 301 acts as an oxidation barrier. Obviously, on account of the material configuration selected (thermally oxidized silicon dioxide/silicon nitride), the first, silicon nitride auxiliary layer 301 acts as a protective layer protecting against the formation of a thermally oxidized silicon dioxide region.

To obtain the layer structure 307 shown in FIG. 3E, the first, silicon nitride auxiliary layer 301 is removed from the laterally delimited layer sequence on the left-hand side of FIG. 3E using a suitable wet-chemical etching process. By contrast, on account of the high etching selectivity (once again in hot phosphoric acid, for example), the second silicon dioxide side wall layer 306 and the first silicon dioxide side wall layer 215 of the laterally delimited layer sequences on the right-hand and left-hand sides of FIG. 3E are not attacked by the etchant.

The result is the layer structure 307 shown in FIG. 3E. The laterally delimited layer sequence on the left-hand side of FIG. 3E has been provided with a thin side wall oxide layer (only the first silicon dioxide side wall layer 215), whereas the laterally delimited layer sequence on the right-hand side of FIG. 3E has been covered with a thick side wall oxide layer (formed by the first silicon dioxide side wall layer 215 and the second silicon dioxide side wall layer 306).

It should be noted that—in particular if the layer structure 307 is used as an arrangement for field-effect transistors—doped surface regions of the substrate 201 which adjoin the laterally delimited layer sequences may be required. Doped regions of this type may be formed at a suitable point during the fabrication method, for example using an ion implantation process.

It is therefore intended that the foregoing detailed description be regarded as illustrative rather than limiting, and that it be understood that it is the following claims, including all equivalents, that are intended to define the spirit and scope of this invention.

We claim:

1. A method for fabricating a layer arrangement, comprising:
   (a) forming at least one first layer sequence, each of which is laterally delimited by a first side wall, at least as part of a logic region of a memory arrangement, on a first surface region of a substrate, and forming at least one second layer sequence, each of which is laterally delimited by a second side wall, at least as part of a memory cell region of the memory arrangement, on a second surface region of the substrate;
   (b) forming a first side wall layer having a first thickness and comprising a first electrically insulating material in at least one sub-region of the first and second side walls of the first and second layer sequences by means of thermal oxidation of the at least one sub-region of the first and second side walls of the first and second layer sequences, wherein the first side wall layer is formed by thermal oxidation such that a second side wall layer formed thereon has different physical properties than the first side wall layer;
   (c) forming the second side wall layer having a second thickness and comprising a second electrically insulating material on at least one sub-region of the first side wall layers of the first and second layer sequences; and
   (d) removing the second side wall layer completely from the at least one first layer sequence; and
   (e) forming doped regions of the substrate proximate to one of the first surface region or the second surface region.

2. The method according to claim 1, wherein (a) further comprises:
   (a1) forming a first, electrically insulating auxiliary layer on the first and second surface regions of the substrate, forming a second, electrically conductive auxiliary layer on the first, electrically insulating auxiliary layer, and forming a third, electrically insulating auxiliary layer on the second, electrically conductive auxiliary layer;
   (a2) removing the first, second and third auxiliary layers from the first surface region of the substrate;
   (a3) forming a fourth, electrically insulating auxiliary layer on the first and second surface regions of the substrate, forming a fifth, electrically conductive auxiliary layer on the fourth, electrically insulating auxiliary layer, and forming a sixth, electrically insulating auxiliary layer on the fifth, electrically conductive auxiliary layer;
   (a4) patterning, jointly, the fifth and sixth auxiliary layers on the first and second surface regions in such a manner that the at least one laterally delimited first layer sequence is formed on the first surface region;
   (a5) Patterning, on the second surface region, the second, third and fourth auxiliary layers such that the at least one second layer sequence, being laterally delimited, is formed on the second surface region.

3. The method according to claim 1 wherein (e) further comprises:
   (e1) introducing doping atoms into surface regions of the substrate which adjoin the lateral end sections of the second layer sequence, after (c) and before (d) and introducing doping atoms into surface regions of the substrate which adjoin the lateral end sections of the first layer sequence after (d).

4. The method according to one of claim 1, wherein (e) further comprises:
   (e1) introducing doping atoms into surface regions of the substrate which adjoin the lateral end sections of the first layer sequence.

5. A layer arrangement comprising:
   a substrate;
   at least one first layer sequence, each of which is laterally delimited by a first side wall, at least as part of a logic region of a memory arrangement, on a first surface region of the substrate;
   at least one second layer sequence, each of which is laterally delimited by a second side wall, at least as part of a memory cell region of the memory arrangement, on a second surface region of the substrate;

a first side wall layer having a first thickness and comprising a first electrically insulating material in at least one sub-region of each of the first and second side walls of each of the first and second layer sequences, the first side wall layer being formed by means of thermal oxidation of the at least one sub-region of each of the first and second side walls of each of the first and second layer sequences;

a second side wall layer having a second thickness and comprising a second electrically insulating material on at least one sub-region of each of the first side wall layers of each of the second layer sequences, the second side wall layers being absent from the first side wall layers of each of the first layer sequences, wherein the first side wall layer has different physical properties than the second side wall layer formed thereon; and doped regions formed in the substrate proximate to at least the first surface region, the doped region proximate to the first surface region having been formed after removal of the second sidewall layers from the first side wall layers of each of the at least one first layer sequences.

6. The method for fabricating a layer arrangement according to claim 1, wherein the second side wall is formed by means of a CVD process and the second side wall layer is removed from the at least one first layer sequence by means of selective etching due to different physical properties of the first and second side wall layers in terms of their interaction with etching chemicals.

7. The method according to claim 2, wherein (e) further comprises further:
(e1) introducing doping atoms into surface regions of the substrate which adjoin the lateral end sections of the second layer sequences, after (c) and before (d) and introducing doping atoms into surface regions of the substrate which adjoin the lateral end sections of the first layer sequence after (d).

8. The method according to one of claim 2, wherein (e) further comprises:
(e1) introducing doping atoms into surface regions of the substrate which adjoin the lateral end sections of the first layer sequence.

9. The method according to claim 3, further comprising subsequent to (d):
(f) introducing doping atoms into surface regions of the substrate which are spatially decoupled from the lateral end sections of the second layer sequences and which partially overlap those surface regions of the substrate into which doping atoms have been introduced.

10. A method for fabricating a layer arrangement, comprising:
(a) forming at least one first layer sequence, each of which is laterally delimited by a first side wall, on a first surface region of a substrate, and forming at least one second layer sequence, each of which is laterally delimited by a second side wall, on a second surface region of the substrate;
(b) forming a first side wall layer having a first thickness and comprising a first electrically insulating material on at least one sub-region of the first and second side walls of the first and second layer sequences;
(c) forming an auxiliary side wall layer on at least one sub-region of the first side wall layers of the first layer sequence;
(d) forming a second side wall layer having a second thickness and comprising a second electrically insulating material on at least one sub-region of the first side wall layer of the second layer sequence, the material used for the auxiliary side wall layer being selected such that, while the second side wall layer is being formed on at least one sub-region of the first side wall layer of the second layer sequence, the auxiliary side wall layer remains uncovered by the second electrically insulating material.

11. The method according to claim 10, further comprising:
(e) removing the auxiliary side wall layer from the first layer stack.

12. The method according to claim 10, in which the second side wall layer is formed by means of thermal oxidation of at least part of the material of the second laterally delimited layer sequence.

13. The method according to one of claim 10, in which the first and second electrically insulating materials are silicon dioxide, and in which the material used for the auxiliary side wall layer is silicon nitride.

14. A memory arrangement having the layer arrangement according to one of claim 10, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

15. The method according to claim 11, in which the second side wall layer is formed by means of thermal oxidation of at least part of the material of the second laterally delimited layer sequence.

16. The method according to one of claim 11, in which the first and second electrically insulating materials are silicon dioxide, and in which the material used for the auxiliary side wall layer is silicon nitride.

17. A memory arrangement having the layer arrangement according to one of claim 11, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

18. The method according to one of claim 12, in which the first and second electrically insulating materials are silicon dioxide, and in which the material used for the auxiliary side wall layer is silicon nitride.

19. A memory arrangement having the layer arrangement according to one of claim 12, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

20. A memory arrangement having the layer arrangement according to one of claim 13, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

21. A memory arrangement having the layer arrangement according to one of claim 5, wherein:

the at least one first layer sequence on the first surface region of the substrate forms at least part of the logic region of the memory arrangement; and the at least one second layer sequence on the second surface region of the substrate forms at least part of the memory cell region of the memory arrangement.

22. The layer arrangement according to claim 5, wherein the first thickness is less than the second thickness.

23. The layer arrangement according to claim 5, wherein the first thickness is between approximately 5 nm and 7 nm.

24. The layer arrangement according to one of claim 5, wherein the second thickness is approximately 10 nm or above.

25. The layer arrangement according to one of claim 5, wherein the substrate is one of a silicon wafer or a silicon chip.

26. The layer arrangement according to one of claim 5, further comprising an insulation layer comprising a third electrically insulating material is arranged on at least part of the surface of the substrate located between the substrate and at least part of the first and/or second layer sequences.

27. The layer arrangement according to one of claim 5, wherein the first layer sequence further comprises a first part-layer comprising a first electrically insulating material and a second part-layer comprising a fourth electrically insulating material.

28. The layer arrangement according to one of claim 5, wherein the second layer sequence further comprises a charge-storage part-layer, a second part-layer comprising a fifth, electrically insulating material, a third part-layer comprising a second, electrically conductive material and a fourth part-layer comprising a sixth, electrically insulating material.

29. A layer arrangement according to claim 5, wherein the first and second side wall layers have different physical properties in terms of their interaction with etching chemicals.

30. The layer arrangement according to claim 22, wherein the first thickness is between approximately 5 nm and 7 nm.

31. The layer arrangement according to one of claim 22, wherein the second thickness is approximately 10 nm or above.

32. The layer arrangement according to one of claim 22, wherein the substrate is one of a silicon wafer or a silicon chip.

33. The layer arrangement according to one of claim 22, further comprising an insulation layer comprising a third electrically insulating material is arranged on at least part of the surface of the substrate located between the substrate and at least part of the first and/or second layer sequences.

34. The layer arrangement according to one of claim 22, wherein the first layer sequence further comprises a first part-layer comprising a first electrically insulating material and a second part-layer comprising a fourth electrically insulating material.

35. The layer arrangement according to one of claim 22, wherein the second layer sequence further comprises a charge-storage part-layer, a second part-layer comprising a fifth, electrically insulating material, a third part-layer comprising a second, electrically conductive material and a fourth part-layer comprising a sixth, electrically insulating material.

36. A memory arrangement having the layer arrangement according to one of claim 22, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

37. The layer arrangement according to one of claim 23, wherein the second thickness is approximately 10 nm or above.

38. The layer arrangement according to one of claim 23, wherein the substrate is one of a silicon wafer or a silicon chip.

39. The layer arrangement according to one of claim 23, further comprising an insulation layer comprising a third electrically insulating material is arranged on at least part of the surface of the substrate located between the substrate and at least part of the first and/or second layer sequences.

40. The layer arrangement according to one of claim 23, wherein the first layer sequence further comprises a first part-layer comprising a first electrically insulating material and a second part-layer comprising a fourth electrically insulating material.

41. The layer arrangement according to one of claim 23, wherein the second layer sequence further comprises a charge-storage part-layer, a second part-layer comprising a fifth, electrically insulating material, a third part-layer comprising a second, electrically conductive material and a fourth part-layer comprising a sixth, electrically insulating material.

42. A memory arrangement having the layer arrangement according to one of claim 23, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

43. The layer arrangement according to one of claim 24, wherein the substrate is one of a silicon wafer or a silicon chip.

44. The layer arrangement according to one of claim 24, further comprising an insulation layer comprising a third electrically insulating material is arranged on at least part of the surface of the substrate located between the substrate and at least part of the first and/or second layer sequences.

45. The layer arrangement according to one of claim 24, wherein the first layer sequence further comprises a first part-layer comprising a first electrically insulating material and a second part-layer comprising a fourth electrically insulating material.

46. The layer arrangement according to one of claim 24, wherein the second layer sequence further comprises a charge-storage part-layer, a second part-layer comprising a fifth, electrically insulating material, a third part-layer comprising a second, electrically conductive material and a fourth part-layer comprising a sixth, electrically insulating material.

47. A memory arrangement having the layer arrangement according to one of claim 24, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

48. The layer arrangement according to one of claim 25, further comprising an insulation layer comprising a third electrically insulating material is arranged on at least part of the surface of the substrate located between the substrate and at least part of the first and/or second layer sequences.

49. The layer arrangement according to one of claim 25, wherein the first layer sequence further comprises a first part-layer comprising a first electrically insulating material and a second part-layer comprising a fourth electrically insulating material.

50. The layer arrangement according to one of claim 25, wherein the second layer sequence further comprises a charge-storage part-layer, a second part-layer comprising a fifth, electrically insulating material, a third part-layer comprising a second, electrically conductive material and a fourth part-layer comprising a sixth, electrically insulating material.

51. A memory arrangement having the layer arrangement according to one of claim 25, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

52. The layer arrangement according to one of claim 26, wherein the first layer sequence further comprises a first part-layer comprising a first electrically insulating material and a second part-layer comprising a fourth electrically insulating material.

53. The layer arrangement according to one of claim 26, wherein the second layer sequence further comprises a charge-storage part-layer, a second part-layer comprising a fifth, electrically insulating material, a third part-layer comprising a second, electrically conductive material and a fourth part-layer comprising a sixth, electrically insulating material.

54. A memory arrangement having the layer arrangement according to one of claim 26, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

55. The layer arrangement according to one of claim 27, wherein the second layer sequence further comprises a charge-storage part-layer, a second part-layer comprising a fifth, electrically insulating material, a third part-layer comprising a second, electrically conductive material and a fourth part-layer comprising a sixth, electrically insulating material.

56. A memory arrangement having the layer arrangement according to one of claim 27, wherein:
the at least one first layer sequence on the first surface region of the substrate forms at least part of the logic region of the memory arrangement; and
the at least one second layer sequence on the second surface region of the substrate forms at least part of the memory cell region of the memory arrangement.

57. The layer arrangement according to claim 28, in which the charge-storage part-layer is one of:
a layer comprising polycrystalline silicon with a silicon dioxide-silicon nitride-silicon dioxide layer sequence (ONO layer) as covering layer; or
a silicon dioxide-silicon nitride-silicon dioxide layer sequence (ONO layer).

58. The layer arrangement according to claim 28, wherein the first and/or second electrically conductive material comprises polycrystalline silicon.

59. The layer arrangement according to one of claim 28, wherein each of the first, second, third, fourth, fifth and sixth electrically insulating materials, comprises one of:
silicon dioxide;
silicon nitride; or
a silicon dioxide-silicon nitride-silicon dioxide layer sequence (ONO layer).

60. The layer arrangement according to claim 57, wherein the first and/or second electrically conductive material comprises polycrystalline silicon.

61. The layer arrangement according to one of claim 57, wherein each of the first, second, third, fourth, fifth and sixth electrically insulating materials, comprises one of:
silicon dioxide;
silicon nitride; or
a silicon dioxide-silicon nitride-silicon dioxide layer sequence (ONO layer).

62. The layer arrangement according to one of claim 58, wherein each of the first, second, third, fourth, fifth and sixth electrically insulating materials, comprises one of:
silicon dioxide;
silicon nitride; or
a silicon dioxide-silicon nitride-silicon dioxide layer sequence (ONO layer).

\* \* \* \* \*